United States Patent
Suemitsu

(10) Patent No.: US 12,447,716 B2
(45) Date of Patent: Oct. 21, 2025

(54) RADIATIVE COOLING DEVICE AND RADIATIVE COOLING METHOD

(71) Applicant: Osaka Gas Co., Ltd., Osaka (JP)

(72) Inventor: Masahiro Suemitsu, Osaka (JP)

(73) Assignee: Osaka Gas Co., Ltd., Osaka (JP)

( * ) Notice: Subject to any disclaimer, the term of this patent is extended or adjusted under 35 U.S.C. 154(b) by 406 days.

(21) Appl. No.: 17/910,646

(22) PCT Filed: Mar. 8, 2021

(86) PCT No.: PCT/JP2021/008966
§ 371 (c)(1),
(2) Date: Sep. 9, 2022

(87) PCT Pub. No.: WO2021/182387
PCT Pub. Date: Sep. 16, 2021

(65) Prior Publication Data
US 2023/0150237 A1 May 18, 2023

(30) Foreign Application Priority Data
Mar. 12, 2020 (JP) .................................. 2020-043486

(51) Int. Cl.
*B32B 7/023* (2019.01)
*F24S 70/225* (2018.01)
(Continued)

(52) U.S. Cl.
CPC ............ *B32B 7/023* (2019.01); *F24S 70/225* (2018.05); *F24S 70/275* (2018.05); *F24S 70/60* (2018.05);
(Continued)

(58) Field of Classification Search
CPC ............... B32B 7/023; B32B 2307/30; B32B 2307/416; B32B 2307/71; F24S 70/225; F24S 70/275; F24S 70/60; F28F 13/02
(Continued)

(56) References Cited

U.S. PATENT DOCUMENTS

| 4,586,350 A | * | 5/1986 | Berdahl | F25B 23/003 |
| | | | | 359/360 |
| 6,451,414 B1 | * | 9/2002 | Wheatley | G02B 5/0841 |
| | | | | 359/359 |

(Continued)

FOREIGN PATENT DOCUMENTS

| CN | 103347684 A | 10/2013 |
| CN | 106575005 A | 4/2017 |

(Continued)

*Primary Examiner* — Jon T. Schermerhorn, Jr.
(74) *Attorney, Agent, or Firm* — The Webb Law Firm

(57) ABSTRACT

The radiative cooling device includes an infrared radiative layer A that radiates infrared light IR from a radiative surface H, a light reflective layer B disposed on a side opposite to the radiative surface H with respect to the infrared radiative layer A, and a protective layer D disposed between the infrared radiative layer A and the light reflective layer B. The infrared radiative layer A is a resin material layer J having a thickness adjusted so as to emit a heat radiation energy greater than an absorbed solar energy in a wavelength range from 8 μm to 14 μm. The light reflective layer B contains silver or a silver alloy, and the protective layer D is formed from a polyolefin based resin with a thickness of 300 nm or more and 40 μm or less or an ethylene terephthalate resin with a thickness of 17 μm or more and 40 μm or less.

21 Claims, 24 Drawing Sheets

(51) Int. Cl.
  *F24S 70/275* (2018.01)
  *F24S 70/60* (2018.01)
  *F28F 13/02* (2006.01)
(52) U.S. Cl.
  CPC .......... *F28F 13/02* (2013.01); *B32B 2307/30* (2013.01); *B32B 2307/416* (2013.01); *B32B 2307/71* (2013.01)
(58) Field of Classification Search
  USPC ......................................................... 165/185
  See application file for complete search history.

(56) References Cited

U.S. PATENT DOCUMENTS

| | | | |
|---|---|---|---|
| 10,386,097 B2* | 8/2019 | Yu | F24S 70/225 |
| 11,359,841 B2* | 6/2022 | Raman | F25B 23/003 |
| 11,820,113 B2* | 11/2023 | Yajima | C08L 45/00 |
| 12,194,723 B2* | 1/2025 | Suemitsu | B32B 15/08 |
| 2015/0131146 A1* | 5/2015 | Fan | G02B 5/208 |
| | | | 359/350 |
| 2015/0369974 A1 | 12/2015 | Tominaga et al. | |
| 2018/0180331 A1 | 6/2018 | Yu et al. | |

FOREIGN PATENT DOCUMENTS

| | | |
|---|---|---|
| CN | 107923718 A | 4/2018 |
| CN | 108603693 A | 9/2018 |
| JP | 2016137666 A | 8/2016 |
| JP | 2018526599 A | 9/2018 |
| WO | 2014129275 A1 | 8/2014 |
| WO | 2016021543 A1 | 2/2016 |
| WO | 2016205717 A1 | 12/2016 |

* cited by examiner

Fig.15
| MATERIAL | FILM THICKNESS | MATERIAL TEMPERATURE | AMBIENT TEMPERATURE | RADIATIVE COOLING PERFORMANCE IN DAYTIME |
|---|---|---|---|---|
| SILICONE RUBBER | 1 | 34.4 | 35.1 | YES |
|  | 5 | 32.8 | 34.5 | YES |
|  | 10 | 33.5 | 35.3 | YES |
| FLUOROETHYLENE VINYL ETHER | 5 | 33.6 | 34.2 | YES |
|  | 10 | 33.7 | 35.0 | YES |
|  | 50 | 32.5 | 34.6 | YES |
| MODIFIED OLEFIN | 1 | 37.4 | 35.0 | NO |
|  | 5 | 37.1 | 35.0 | NO |
|  | 10 | 37.3 | 35.4 | NO |
| VINYL CHLORIDE RESIN | 80 | 26.5 | 29.5 | YES |
|  | 300 | 27.4 | 28.2 | YES |
Fig.16
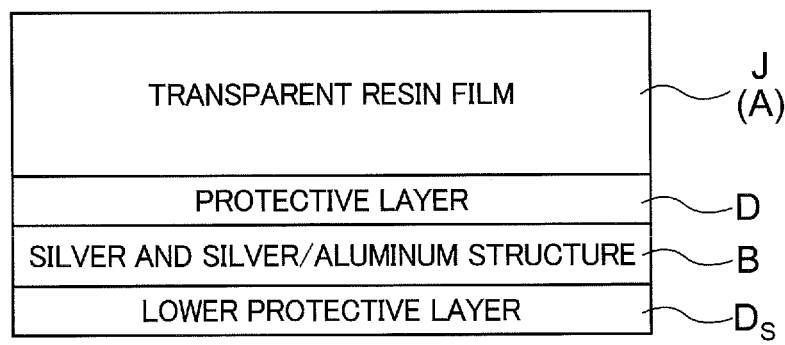
Fig.17
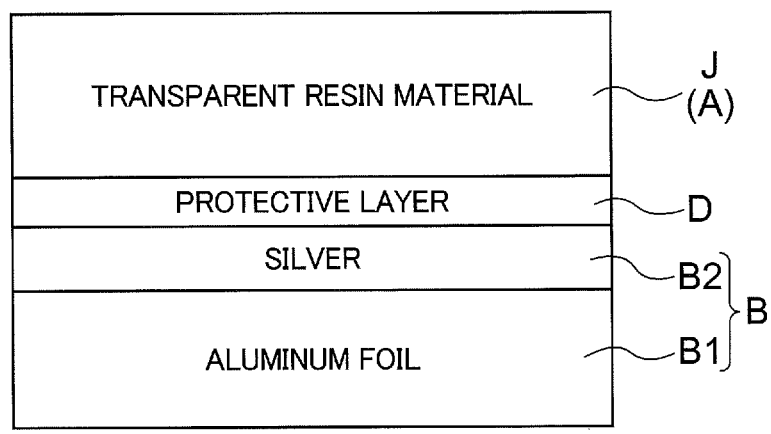

ly methacrylate with a thickness of 50 nm (see Patent Document 1, for example).

PATENT DOCUMENTS

Patent Document 1: JP 2018-526599A

SUMMARY OF THE INVENTION

In the configuration in which aluminum oxide and silicon dioxide are contained in the protective layer of the conventional radiative cooling device disclosed in Patent Document 1, the protective layer is formed from inorganic materials and therefore lacks flexibility. That is, even if the infrared radiative layer is constituted by a flexible resin material layer and the light reflective layer is constituted by, for example, a thin silver film and is flexible, the radiative cooling device lacks flexibility because the protective layer constituted by the inorganic materials lacks flexibility. Moreover, when the protective layer follows the flexibility of the infrared radiative layer, the protective layer cracks or is peeled off and loses its protective function. That is, the conventional radiative cooling device in which inorganic materials are used in the protective layer lacks flexibility.

Therefore, it is difficult to impart radiative cooling properties to external walls having any shape in existing outdoor facilities or the like through post attachment of the conventional radiative cooling device in which the protective layer is constituted by inorganic materials.

In the configuration in which the protective layer of the conventional radiative cooling device disclosed in Patent Document 1 is formed from polymethylmethacrylate with a thickness of 50 nm, there is a problem in that the protective layer is deteriorated in a short period of time by absorbing ultraviolet rays and silver or a silver alloy forming the reflective layer is discolored.

That is, the protective layer needs to suppress discoloration of silver or a silver alloy forming the reflective layer by exhibiting blocking action of blocking radicals generated in the resin material layer so as not to reach silver or the silver alloy forming the reflective layer and also blocking moisture that has permeated through the resin material layer so as not to reach silver or the silver alloy forming the protective layer, for example.

However, the protective layer formed from polymethylmethacrylate with a thickness of 50 nm is deteriorated in a short period of time by absorbing ultraviolet rays and fails to exhibit the blocking action described above, and therefore, there is a problem in that silver or the silver alloy forming the reflective layer is discolored when the short period of time has elapsed.

When silver or the silver alloy forming the reflective layer is discolored, the reflective layer cannot reflect sunlight appropriately and the temperature increases through absorption of sunlight, and consequently the radiative cooling device cannot cool the cooling target under solar radiation in the daytime.

The present invention was made in view of the above circumstances and has an object of providing a radiative cooling device that is flexible and capable of cooling a cooling target under solar radiation, and a radiative cooling method in which the radiative cooling device is used.

A radiative cooling device according to the present invention includes an infrared radiative layer configured to radiate infrared light from a radiative surface, a light reflective layer disposed on a side opposite to the radiative surface with respect to the infrared radiative layer, and a protective layer disposed between the infrared radiative layer and the light reflective layer,

RADIATIVE COOLING DEVICE AND RADIATIVE COOLING METHOD

CROSS-REFERENCE TO RELATED APPLICATIONS

This application is the United States national phase of International Application No. PCT/JP2021/008966 filed, Mar. 8, 2021, and claims priority to Japanese Patent Application No. 2020-043486 filed Mar. 12, 2020, the disclosures of which are hereby incorporated by reference in their entirety.

BACKGROUND OF THE INVENTION

Field of the Invention

The present invention relates to a radiative cooling device including an infrared radiative layer that radiates infrared light from a radiative surface, a light reflective layer disposed on a side opposite to the radiative surface with respect to the infrared radiative layer, and a protective layer disposed between the infrared radiative layer and the light reflective layer, wherein the infrared radiative layer is a resin material layer that has a thickness adjusted so as to emit a heat radiation energy greater than an absorbed solar energy in a wavelength range from 8 µm to 14 µm, and the light reflective layer contains silver or a silver alloy.

The present invention also relates to a radiative cooling method in which the radiative cooling device is used.

Description of Related Art

Radiative cooling refers to a phenomenon in which the temperature of a substance decreases as a result of the substance radiating electromagnetic waves such as infrared rays to the surrounding environment. By using this phenomenon, it is possible to configure, for example, a radiative cooling device that cools a cooling target without consuming energy such as electricity.

The cooling target can be cooled even under solar radiation in the daytime as a result of a light reflective layer that contains silver or a silver alloy sufficiently reflecting sunlight.

That is, the light reflective layer reflects light (ultraviolet light, visible light, infrared light) transmitted through an infrared radiative layer and causes the light to be radiated from a radiative surface. This avoids a situation in which the light (ultraviolet light, visible light, infrared light) transmitted through the infrared radiative layer is projected onto the cooling target and the cooling target is heated, and thus the cooling target can be cooled even under solar radiation in the daytime.

In addition to light transmitted through the infrared radiative layer, light radiated from the infrared radiative layer toward the light reflective layer is also reflected by the light reflective layer toward the infrared radiative layer, but in the following description, the light reflective layer is described as being provided for the purpose of reflecting light (ultraviolet light, visible light, infrared light) transmitted through the infrared radiative layer.

As a conventional example of such a radiative cooling device, there is a radiative cooling device including a protective layer that contains aluminum oxide and silicon dioxide or a protective layer that is formed from polymethwherein the infrared radiative layer is a resin material layer that has a thickness adjusted so as to emit a heat radiation energy greater than an absorbed solar energy in a wavelength range from 8 µm to 14 µm, and the light reflective layer contains silver or a silver alloy, and the radiative cooling device is characterized in that the protective layer is formed from a polyolefin based resin with a thickness of 300 nm or more and 40 µm or less or an ethylene terephthalate resin with a thickness of 17 µm or more and 40 µm or less.

That is, sunlight incident on the radiative surface of the resin material layer, which is the infrared radiative layer, is transmitted through the resin material layer and the protective layer, and then reflected by the light reflective layer disposed on the side opposite to the radiative surface with respect to the resin material layer, and released from the radiative surface to the outside of the system.

Note that, when the description of the present specification simply refers to light, the concept of the light encompasses ultraviolet light (ultraviolet rays), visible light, and infrared light. When these are described in terms of the wavelength of light, which is electromagnetic waves, the light encompasses electromagnetic waves having wavelengths of 10 nm to 20000 nm (electromagnetic waves having wavelengths of 0.01 µm to 20 µm).

Also, heat conducted (input) to the radiative cooling device is converted to infrared rays in the resin material layer and released from the radiative surface to the outside of the system.

As described above, with the above configuration, it is possible to reflect sunlight emitted toward the radiative cooling device and also radiate, as infrared light, heat conducted to the radiative cooling device (e.g., heat conducted from the atmosphere or a cooling target that is cooled by the radiative cooling device) toward the outside of the system.

Moreover, the resin material layer has a thickness adjusted so as to emit a heat radiation energy greater than an absorbed solar energy in the wavelength range from 8 µm to 14 µm, and additionally, the protective layer is formed from a polyolefin based resin with a thickness of 300 nm or more and 40 µm or less or an ethylene terephthalate resin with a thickness of 17 µm or more and 40 µm or less. Therefore, it is possible to suppress discoloration of silver or a silver alloy constituting the light reflective layer even under solar radiation in the daytime, and accordingly, the radiative cooling device can exhibit a cooling function even under solar radiation in the daytime while sunlight is appropriately reflected by the light reflective layer.

The resin material layer is formed from a resin material having high flexibility, and accordingly is flexible. Furthermore, the protective layer is formed from a resin material having high flexibility, and accordingly is flexible. Note that it is possible to make the light reflective layer flexible by forming the light reflective layer as a thin silver film, for example.

Therefore, the radiative cooling device including the resin material layer, the protective layer, and the light reflective layer can be made flexible.

The following is an additional description of suppression of discoloration of silver or a silver alloy constituting the light reflective layer by the protective layer.

In a case where the protective layer is not provided, there is a risk of the light reflective layer failing to appropriately exhibit its light reflecting function as a result of silver or a silver alloy constituting the light reflective layer being discolored in a short period of time due to radicals generated in the resin material layer reaching silver or the silver alloy constituting the light reflective layer or moisture that has permeated through the resin material layer reaching silver or the silver alloy constituting the light reflective layer. However, when the protective layer is provided, it is possible to keep silver or the silver alloy constituting the light reflective layer from being discolored in a short period of time.

In the case where the protective layer is formed from a polyolefin based resin with a thickness of 300 nm or more and 40 µm or less, the protective layer is unlikely to be deteriorated by absorbing ultraviolet rays because the polyolefin based resin is a synthetic resin that has an absorptivity of 10% or less for ultraviolet rays over the entire wavelength range of ultraviolet rays from 0.3 µm to 0.4 µm.

Moreover, since the thickness of the polyolefin based resin forming the protective layer is 300 nm or more, the protective layer favorably exhibits a blocking function of blocking radicals generated in the resin material layer so as not to reach silver or the silver alloy forming the light reflective layer and blocking moisture that has permeated through the resin material layer so as not to reach silver or the silver alloy forming the light reflective layer, and thus it is possible to suppress discoloration of silver or the silver alloy forming the light reflective layer.

Although the protective layer formed from the polyolefin based resin is deteriorated while forming radicals by absorbing ultraviolet rays on the side of its surface disposed away from the light reflective layer, the generated radicals do not reach the light reflective layer because the protective layer has a thickness of 300 nm or more. Also, although the protective layer is deteriorated while forming radicals, the progress of deterioration is slow due to absorption of ultraviolet rays is low, and therefore, the protective layer exhibits the above-described blocking function for a long period of time.

In the case where the protective layer is formed from an ethylene terephthalate resin with a thickness of 17 µm or more and 40 µm or less, the ethylene terephthalate resin is a synthetic resin that has a higher absorptivity for ultraviolet rays than the polyolefin based resin in the wavelength range of ultraviolet rays from 0.3 µm to 0.4 µm. However, the protective layer has a thickness of 17 µm or more, and accordingly, radicals generated in a portion of the protective layer near its surface disposed away from the light reflective layer can be prevented from reaching the light reflective layer. Also, since the protective layer has a thickness of 17 µm or more, the protective layer favorably exhibits the blocking function of blocking radicals generated in the resin material layer so as not to reach silver or the silver alloy forming the light reflective layer and blocking moisture that has permeated through the resin material layer so as not to reach silver or the silver alloy forming the light reflective layer for a long period of time, and thus it is possible to suppress discoloration of silver or the silver alloy forming the protective layer.

That is, the protective layer formed from the ethylene terephthalate resin is deteriorated while forming radicals by absorbing ultraviolet rays on the side of its surface disposed away from the light reflective layer, but the generated radicals do not reach the light reflective layer because the protective layer has a thickness of 17 µm or more. Also, although the protective layer is deteriorated while forming radicals, the protective layer has a thickness of 17 µm or more, and accordingly, exhibits the above-described blocking function for a long period of time.

Note that the upper limit value of the thickness of the protective layer is set for the cases where the protective layer is formed from the polyolefin based resin or the ethylene terephthalate resin in order to avoid a situation in which the protective layer exhibits thermal insulation properties, which do not contribute to radiative cooling. That is, as the thickness of the protective layer is increased, the protective layer exhibits thermal insulation properties, which do not contribute to radiative cooling, and therefore, the upper limit value of the thickness is set to prevent the protective layer from exhibiting thermal insulation properties, which do not contribute to radiative cooling, while allowing the protective layer to exhibit the function of protecting the light reflective layer.

In short, with the characteristic configuration of the radiative cooling device according to the present invention, it is possible to provide a radiative cooling device that is flexible and capable of cooling a cooling target in the daytime.

In another characteristic configuration of the radiative cooling device of the present invention, the light reflective layer has a reflectance of 90% or more for light having a wavelength within a range from 0.4 µm to 0.5 µm and a reflectance of 96% or more for light having a wavelength longer than 0.5 µm.

The spectrum of sunlight spans from a wavelength of 0.3 µm to a wavelength of 4 µm, and the intensity increases as the wavelength increases from 0.4 µm, and the intensity is particularly high in a wavelength range from 0.5 µm to 2.5 µm.

When the light reflective layer has reflection properties satisfying a reflectance of 90% or more for light having a wavelength within a range from 0.4 µm to 0.5 µm and a reflectance of 96% or more for light having a wavelength longer than 0.5 µm, solar energy absorbed by the light reflective layer is as small as about 5% or less.

Consequently, solar energy absorbed by the light reflective layer at the time of meridian transit in summer can be suppressed to about 50 W/m² or less, and the resin material layer can favorably perform radiative cooling.

Note that, in the present specification, the spectrum of sunlight is in accordance with the standard of AM1.5G, unless otherwise stated.

In short, according to the above-described characteristic configuration of the radiative cooling device of the present invention, it is possible to suppress absorption of solar energy by the light reflective layer and allow the resin material layer to favorably perform radiative cooling.

In another characteristic configuration of the radiative cooling device of the present invention, the thickness of the resin material layer is adjusted such that the resin material layer has:

light absorption properties that satisfy a wavelength average absorptivity of 13% or less in a wavelength range from 0.4 µm to 0.5 µm, a wavelength average absorptivity of 4% or less in a wavelength range from 0.5 µm to 0.8 µm, a wavelength average absorptivity of 1% or less in a wavelength range from 0.8 µm to 1.5 µm, and a wavelength average absorptivity of 40% or less in a wavelength range from 1.5 µm to 2.5 µm; and heat radiation properties that satisfy a wavelength average emissivity of 40% or more in a wavelength range from 8 µm to 14 µm.

Note that the wavelength average absorptivity in the wavelength range from 0.4 µm to 0.5 µm refers to an average value of absorptivities at respective wavelengths within the range from 0.4 µm to 0.5 µm. The same applies to the wavelength average absorptivity in the wavelength range from 0.5 µm to 0.8 µm, the wavelength average absorptivity in the wavelength range from 0.8 µm to 1.5 µm, and the wavelength average absorptivity in the wavelength range from 1.5 µm to 2.5 µm. Also, similar descriptions including the description of emissivity refer to similar average values, and this applies to the following description of the present specification.

The absorptivity and the emissivity (light emissivity) of the resin material layer vary according to the thickness of the resin material layer. Therefore, the thickness of the resin material layer needs to be adjusted so as not to absorb sunlight as far as possible and so as to radiate a large amount of heat in the wavelength band of so-called atmospheric window (light wavelength range from 8 µm to 20 µm).

Specifically, from the viewpoint of absorptivity (light absorption properties) of the resin material layer for sunlight, the wavelength average absorptivity in the wavelength range from 0.4 µm to 0.5 µm needs to be 13% or less, the wavelength average absorptivity in the wavelength range from 0.5 µm to 0.8 µm needs to be 4% or less, the wavelength average absorptivity in the wavelength range from 0.8 µm to 1.5 µm needs to be 1% or less, and the wavelength average absorptivity in the wavelength range from 1.5 µm to 2.5 µm needs to be 40% or less. Note that a wavelength average absorptivity in a wavelength range from 2.5 µm to 4 µm may be 100% or less.

If the case of such an absorptivity distribution, the absorptivity for sunlight is 10% or less, which corresponds to an energy of 100 W or less.

The absorptivity for sunlight increases as the film thickness of the resin material layer is increased. When the resin material layer is made thick, the emissivity in the atmospheric window becomes approximately 1, and the amount of heat radiated toward the universe at that time is 125 W/m² to 160 W/m².

As described above, the amount of sunlight absorbed by the light reflective layer is preferably 50 W/m² or less.

Accordingly, cooling progresses if the sum of amounts of sunlight absorbed by the resin material layer and the light reflective layer is 150 W/m² or less and the atmosphere is in good conditions. It is preferable to use a resin material layer that has a small absorptivity in the vicinity of a peak value of the sunlight spectrum as described above.

Also, from the viewpoint of infrared radiation (heat radiation properties) of the resin material layer, the wavelength average emissivity in the wavelength range from 8 µm to 14 µm needs to be 40% or more.

That is, in order to emit heat radiation of about 50 W/m² absorbed from sunlight by the light reflective layer to the universe from the resin material layer, the resin material layer needs to radiate heat more than or equal to the absorbed heat.

For example, when the ambient temperature is 30° C., the maximum heat radiation in the atmospheric window of the wavelength range from 8 µm to 14 µm is 200 W/m² (calculated with the emissivity taken as 1). This value can be obtained in an environment in which the air is thin and very dry, such as an environment on a high mountain, in cloudless weather. When compared with a high mountain, the thickness of the atmosphere increases in a lowland, for example, and accordingly, the wavelength band of the atmospheric window becomes narrower and the transmittance decreases. This is said as "the atmospheric window becoming narrower".

Also, the radiative cooling device is actually used in a humid environment, and the atmospheric window becomes narrower in such a case as well. When the radiative cooling device is used in a lowland, heat radiation in the atmospheric window band is estimated to be 160 W/m² (calculated with the emissivity taken as 1) at 30° C. under good conditions.

Moreover, when there is haze or smog in the sky, as is often the case in Japan, the atmospheric window further becomes narrower and radiation to the universe becomes about 125 W/m².

In view of the foregoing, the radiative cooling device cannot be used in a lowland in the mid-latitude area unless the wavelength average emissivity in the wavelength range from 8 μm to 14 μm is 40% or more (heat radiation intensity in the atmospheric window band is 50 W/m² or more).

Therefore, when the thickness of the resin material layer is adjusted so as to fall within the range of optical prescriptions described above, the amount of heat output in the atmospheric window becomes greater than the amount of heat input through absorption of sunlight, and radiative cooling can be performed in an outdoor environment even under solar radiation in the daytime.

In short, according to the above-described characteristic configuration of the radiative cooling device of the present invention, the amount of heat output in the atmospheric window becomes greater than the amount of heat input through absorption of sunlight, and radiative cooling can be performed in an outdoor environment even under solar radiation.

In another characteristic configuration of the radiative cooling device of the present invention, a resin material forming the resin material layer is selected from resins that have any one or two or more of a carbon-fluorine bond, a siloxane bond, a carbon-chlorine bond, a carbon-oxygen bond, an ether bond, an ester bond, and a benzene ring.

That is, as the resin material forming the resin material layer, it is possible to use a colorless resin material that has any one or two or more of a carbon-fluorine bond (C—F), a siloxane bond (Si—O—Si), a carbon-chlorine bond (C—Cl), a carbon-oxygen bond (C—O), an ether bond (R—COO—R), an ester bond (C—O—C), and a benzene ring.

According to Kirchhoff's law, the emissivity (ε) is equal to the absorptivity (A). The absorptivity (A) can be determined from an absorption coefficient (α) and the following expression 1.

$$A = 1 - \exp(-\alpha t) \quad \text{(expression 1)}$$

Note that t represents a film thickness.

That is, by increasing the thickness of the resin material layer, it is possible to obtain a large amount of heat radiation in a wavelength band in which the absorption coefficient is large. In a case where radiative cooling is performed outdoors, it is preferable to use a material that has a large absorption coefficient in the wavelength band of the atmospheric window, which is from 8 μm to 14 μm. Also, in order to suppress absorption of sunlight, it is preferable to use a material that does not have an absorption coefficient or has a small absorption coefficient in a wavelength range from 0.3 μm to 4 μm, and particularly from 0.4 μm to 2.5 μm. As can be understood from the relational expression 1 of the absorption coefficient and the absorptivity, the absorptivity (emissivity) varies according to the film thickness of the resin material layer.

In order to make the temperature lower than the temperature of the surrounding atmosphere through radiative cooling under solar radiation, it is possible to create a state in which almost no sunlight is absorbed but a large amount of heat is radiated in the atmospheric window, i.e., output of radiative cooling is greater than input of sunlight, by selecting, as the resin material forming the resin material layer, a material that has a large absorption coefficient in the wavelength band of the atmospheric window and almost no absorption coefficient in the wavelength band of sunlight and by adjusting the film thickness of the resin material layer.

The following is an additional description of absorption spectrums of resin materials that can be used to form the resin material layer.

As for the carbon-fluorine bond (C—F), absorption coefficients of CHF and $CF_2$ are widely spread in the wide wavelength band from 8 μm to 14 μm, which is the atmospheric window, and an absorption coefficient at 8.6 μm is particularly large. Regarding the wavelength band of sunlight, there is no noticeable absorption coefficient in the wavelength range from 0.3 μm to 2.5 μm in which the energy is high.

Examples of resin materials that have a C—F bond include:
  polytetrafluoroethylene (PTFE), which is a fully fluorinated resin;
  polychlorotrifluoroethylene (PCTFE), polyvinylidene fluoride (PVDF), and polyvinyl fluoride (PVF), which are partially fluorinated resins;
  a perfluoroalkoxy fluorocarbon resin (PFA), which is a fluorinated resin copolymer;
  a tetrafluoroethylene-hexafluoropropylene copolymer (FEP);
  an ethylene-tetrafluoroethylene copolymer (ETFE); and
  an ethylene-chlorotrifluoroethylene copolymer (ECTFE).

When polyvinylidene fluoride (PVDF) is taken as a representative example, bond energies of a C—C bond, a C—H bond, and a C—F bond in the basic structural unit are 4.50 eV, 4.46 eV, and 5.05 eV. These energies correspond to a wavelength of 0.275 μm, a wavelength of 0.278 μm, and a wavelength of 0.246 μm, respectively, and the resin absorbs light having a wavelength shorter than these wavelengths.

Since the sunlight spectrum includes only wavelengths longer than 0.300 μm, when a fluorocarbon resin is used, the resin absorbs almost no ultraviolet rays, visible rays, and near-infrared rays of sunlight.

Note that ultraviolet rays are defined as light having a wavelength shorter than 0.400 μm, visible rays are defined as light in a wavelength range from 0.400 μm to 0.800 μm, near-infrared rays are defined as light in a wavelength range from 0.800 μm to 3 μm, mid-infrared rays are defined as light in a wavelength range from 3 μm to 8 μm, and far-infrared rays are defined as light having a wavelength longer than 8 μm.

Examples of resin materials that have a siloxane bond (Si—O—Si) include silicone rubber and a silicone resin. In the cases of these resins, a large absorption coefficient for stretching of C—Si bonds appears broadly around a wavelength of 13.3 μm, an absorption coefficient for out-of-plane bending (wagging) of $CSiH_2$ appears broadly around a wavelength of 10 μm, and an absorption coefficient for in-plane bending (scissoring) of $CSiH_2$ slightly appears in the vicinity of a wavelength of 8 μm. As described above, these resins have a large absorption coefficient in the atmospheric window. Regarding the ultraviolet range, bond energy of Si—O—Si constituting the main chain is 4.60 eV, which corresponds to a wavelength of 0.269 μm, and these resins absorb light having a wavelength shorter than 0.269 μm. Since the sunlight spectrum includes only wavelengths longer than 0.300 μm, when a resin having a siloxane bond is used, the resin absorbs almost no ultraviolet rays, visible rays, and near-infrared rays of sunlight.

As for the carbon-chlorine bond (C—Cl), an absorption coefficient for stretching vibration of C—Cl appears around a wavelength of 12 μm over a wide range with a half width of 1 μm or more.

Examples of resin materials that have a carbon-chlorine bond (C—Cl) include polyvinyl chloride (PVC). In the case of polyvinyl chloride, an absorption coefficient for bending vibration of C—H in an alkene contained in the main chain appears at a wavelength of about 10 μm under the influence of electron-withdrawing of chlorine. That is, the resin can radiate a large amount of heat in the wavelength band of the atmospheric window. Note that bond energy between carbon and chlorine in an alkene is 3.28 eV, which corresponds to a wavelength of 0.378 μm, and the resin absorbs light having a wavelength shorter than 0.378 μm. That is, ultraviolet rays in sunlight are absorbed, but almost no light in the visible range is absorbed.

The ether bond (R—COO—R) and the ester bond (C—O—C) have absorption coefficients in a wavelength range from 7.8 μm to 9.9 μm. As for a carbon-oxygen bond contained in the ester bond and the ether bond, a large absorption coefficient appears in a wavelength range from 8 μm to 10 μm.

When a benzene ring is introduced into a side chain of a hydrocarbon resin, absorption appears broadly in a wavelength range from 8.1 μm to 18 μm due to vibration of the benzene ring itself and vibration of surrounding elements under the influence of the benzene ring.

Examples of resins that have these bonds include a polymethyl methacrylate resin, an ethylene terephthalate resin, polytrimethylene terephthalate, polybutylene terephthalate, polyethylene naphthalate, and polybutylene naphthalate. For example, bond energy of a C—C bond in methyl methacrylate is 3.93 eV, which corresponds to a wavelength of 0.315 μm, and methyl methacrylate absorbs sunlight having a wavelength shorter than 0.315 μm, but absorbs almost no light in the visible range.

The resin material layer may be any of a single-layer film made of a single resin material, a multilayer film made of a plurality of resin materials, a single-layer film made of a blend of a plurality of resin materials, and a multilayer film made of blends of a plurality of resin materials, as long as resin materials forming the resin material layer have the above-described characteristics of the emissivity and the absorptivity. Note that a blend encompasses copolymers such as an alternating copolymer, a random copolymer, a block copolymer, and a graft copolymer, and a modified product obtained by substituting a side chain.

In short, according to the above-described characteristic configuration of the radiative cooling device of the present invention, it is possible to create a state in which output of radiative cooling is greater than input of sunlight.

In another characteristic configuration of the radiative cooling device of the present invention, a resin material forming the resin material layer contains siloxane as a main component, and the resin material layer has a thickness of 1 μm or more.

That is, as can be understood from the above-described expression 1: $A=1-\exp(-\alpha t)$, the absorptivity (emissivity) varies according to the thickness t. The resin material needs to have a thickness at which the absorptivity (emissivity) of the resin material has a large absorption coefficient in the atmospheric window.

In the case of a resin material that is mainly composed of siloxane bonds (Si—O—Si), when the film thickness is 1 μm or more, radiation intensity in the atmospheric window becomes high, and it is possible to create a state in which output of radiative cooling is greater than input of sunlight.

In short, according to the above-described characteristic configuration of the radiative cooling device of the present invention, it is possible to create a state in which output of radiative cooling is greater than input of sunlight in the case where the main component of the resin material forming the resin material layer is siloxane.

In another characteristic configuration of the radiative cooling device of the present invention, the resin material layer has a thickness of 10 μm or more.

That is, in the case of a resin material that is mainly composed of any of carbon-fluorine bonds (C—F), carbon-chlorine bonds (C—Cl), carbon-oxygen bonds (C—O), ester bonds (R—COO—R), ether bonds (C—O—C), and benzene rings, when the film thickness is 10 μm or more, radiation intensity in the atmospheric window becomes high, and it is possible to create a state in which output of radiative cooling is greater than input of sunlight.

In short, according to this characteristic configuration of the radiative cooling device of the present invention, it is possible to create a state in which output of radiative cooling is greater than input of sunlight in the case where the resin material forming the resin material layer is mainly composed of any of carbon-fluorine bonds (C—F), carbon-chlorine bonds (C—Cl), carbon-oxygen bonds (C—O), ester bonds (R—COO—R), ether bonds (C—O—C), and benzene rings.

In another characteristic configuration of the radiative cooling device of the present invention, the resin material layer has a thickness of 20 mm or less.

Heat radiation from the resin material forming the resin material layer in the atmospheric window occurs in a portion of the resin material that is within a depth of about 100 μm from the surface.

That is, even if the thickness of the resin material is increased, the thickness of the portion of the resin material that contributes to radiative cooling does not change, and the remaining portion of the resin material insulates cold heat obtained through radiative cooling. If an ideal resin material layer that does not absorb sunlight at all is obtained, sunlight is only absorbed by the light reflective layer of the radiative cooling device.

Resin materials generally have a thermal conductivity of about 0.2 W/m·K, and when a calculation is performed taking the thermal conductivity into account, the temperature of a cooling surface (a surface of the light reflective layer on the side opposite to the resin material layer) increases when the thickness of the resin material layer is larger than 20 mm. Even if there is an ideal resin material that does not absorb sunlight at all, the thermal conductivity of a resin material is generally about 0.2 W/m·K, and accordingly, when the thickness of the resin material layer is 20 mm or more, the cooling target cannot be cooled with the cooling surface through heat radiation (radiative cooling) performed by the resin material layer, and is heated by solar radiation. Therefore, the resin material layer cannot be made to have a thickness of 20 mm or more.

In short, according to the above-described characteristic configuration of the radiative cooling device of the present invention, it is possible to appropriately cool the cooling target.

In another characteristic configuration of the radiative cooling device of the present invention, a resin material forming the resin material layer is a fluorocarbon resin or silicone rubber.

Fluorocarbon resins mainly composed of carbon-fluorine bonds (C—F), i.e., polytetrafluoroethylene (PTFE), polychlorotrifluoroethylene (PCTFE), polyvinylidene fluoride (PVDF), polyvinyl fluoride (PVF), perfluoroalkoxy fluorocarbon resin (PFA), and a tetrafluoroethylene-hexafluoropropylene copolymer (FEPP) hardly have light absorption properties in the ultraviolet range, the visible range, and the near-infrared range of the sunlight spectrum.

Also, similarly to the fluorocarbon resins, a resin that contains a siloxane bond (Si—O—Si) as a main chain and contains a side chain having a low molecular weight, i.e., silicone rubber hardly has light absorption properties in the ultraviolet range, the visible range, and the near-infrared range of the sunlight spectrum.

The fluorocarbon resins and silicone rubber have a thermal conductivity of 0.2 W/m·K, and accordingly, these resins exhibit a radiative cooling function even when the film thickness is increased to 20 mm.

In short, according to this characteristic configuration of the radiative cooling device of the present invention, the radiative cooling function can be appropriately exhibited in the case where the resin material of the resin material layer is a fluorocarbon resin or silicone rubber.

In another characteristic configuration of the radiative cooling device of the present invention, a resin material forming the resin material layer is a resin that contains, as a main chain, a hydrocarbon that has any one or two or more of a carbon-chlorine bond, a carbon-oxygen bond, an ester bond, an ether bond, and a benzene ring, or a silicone resin that contains a hydrocarbon having 2 or more carbon atoms as a side chain, and the resin material layer has a thickness of 500 μm or less.

In the case where the resin material forming the resin material layer is a resin that contains, as a main chain, a hydrocarbon having any one or two or more of a carbon-chlorine bond (C—F), a carbon-oxygen bond (C—O), an ester bond (R—COO—R), an ether bond (C—O—C), and a benzene ring or the resin material is a silicone resin that contains a hydrocarbon having 2 or more carbon atoms as a side chain, absorption through vibration, such as bending or stretching of bonds appears in the near-infrared range, in addition to ultraviolet ray absorption by electrons contributing to covalent bonds.

Specifically, absorption based on fundamental tones of transitions of $CH_3$, $CH_2$, and CH to the first excited state appears in a wavelength range from 1.6 μm to 1.7 μm, a wavelength range from 1.65 μm to 1.75 μm, and at a wavelength of 1.7 μm, respectively. Furthermore, absorption based on fundamental tones of combination tones of $CH_3$, $CH_2$, and CH appears at a wavelength of 1.35 μm, a wavelength of 1.38 μm, and a wavelength of 1.43 μm, respectively. Furthermore, overtones of transitions of $CH_2$ and CH to the second excited state appear around a wavelength of 1.24 μm. Fundamental tones of bending and stretching of a C—H bond are widely distributed in a wavelength range from 2 μm to 2.5 μm. Also, if the resin has a structural formula such as $R_1$—$CO_2$—$R_2$, large light absorption appears around a wavelength of 1.9 μm.

For example, a polymethyl methacrylate resin, an ethylene terephthalate resin, polytrimethylene terephthalate, polybutylene terephthalate, polyethylene naphthalate, polybutylene naphthalate, and polyvinyl chloride show similar light absorption properties in the near-infrared range due to $CH_3$, $CH_2$, and CH. When the thickness of the resin material layer made of any of these resin materials is increased to 20 mm, which is a value set from the viewpoint of thermal conductivity, the resin material layer is heated by absorbing near-infrared rays included in sunlight. Therefore, the thickness needs to be set to 500 μm or less when these resin materials are used.

In short, according to the above-described characteristic configuration of the radiative cooling device of the present invention, it is possible to suppress absorption of near-infrared rays in the cases where the resin material is a resin that contains, as a main chain, a hydrocarbon that has any one or two or more of a carbon-chlorine bond, a carbon-oxygen bond, an ester bond, an ether bond, and a benzene ring, or a silicone resin that contains a hydrocarbon having 2 or more carbon atoms as a side chain.

In another characteristic configuration of the radiative cooling device of the present invention, a resin material forming the resin material layer is a blend of a resin that has a carbon-fluorine bond or a siloxane bond and a resin that contains a hydrocarbon as a main chain, and the resin material layer has a thickness of 500 μm or less.

In the case where the resin material forming the resin material layer is obtained by blending a resin that contains a carbon-fluorine bond (C—F) or a siloxane bond (Si—O—Si) as a main chain and a resin that contains a hydrocarbon as a main chain, light absorption by CH, $CH_2$, $CH_3$, or the like appears in the near-infrared range according to the proportion of the blended resin containing a hydrocarbon as a main chain. When the carbon-fluorine bond or the siloxane bond is the main component, light absorption by the hydrocarbon in the near-infrared range is small, and therefore, the thickness can be increased up to 20 mm, which is the upper limit set from the viewpoint of thermal conductivity. However, when the blended hydrocarbon resin is the main component, the thickness needs to be set to 500 μm or less.

A blend of a hydrocarbon and a fluorocarbon resin or silicone rubber encompasses a product obtained by substituting a side chain of the fluorocarbon resin or silicone rubber with the hydrocarbon, and an alternating copolymer, a random copolymer, a block copolymer, and a graft copolymer of a hydrocarbon monomer and a fluorine monomer or a silicone monomer. Examples of alternating copolymers of a fluorine monomer and a hydrocarbon monomer include fluoroethylene-viny ester (FEVE), a fluoroolefin-acrylic ester copolymer, an ethylene-tetrafluoroethylene copolymer (ETFE), and an ethylene-chlorotrifluoroethylene copolymer (ECTFE).

Light absorption by CH, $CH_2$, $CH_3$, or the like in the near-infrared range appears according to the molecular weight and proportion of the hydrocarbon side chain, which serves as a substituent.

When the monomer introduced as a side chain or a copolymerization monomer has a low molecular weight or the density of the introduced monomer is low, light absorption by the hydrocarbon in the near-infrared range is small, and therefore, the thickness can be increased to the upper limit of 20 mm set from the viewpoint of thermal conductivity.

When a high-molecular weight hydrocarbon is introduced as a side chain or a copolymerization monomer into a fluorocarbon resin or silicone rubber, the thickness of the resin needs to be set to 500 μm or less.

In short, according to the above-described characteristic configuration of the radiative cooling device of the present invention, it is possible to suppress absorption of near-infrared rays in the case where the resin material is a blend of a resin that has a carbon-fluorine bond or a siloxane bond and a resin that contains a hydrocarbon as a main chain.

In another characteristic configuration of the radiative cooling device of the present invention, a resin material forming the resin material layer is a fluorocarbon resin, and the resin material layer has a thickness of 300 μm or less.

From the viewpoint of practical use of the radiative cooling device, the thinner the resin material layer is, the better. The thermal conductivity of a resin material is generally lower than those of metal, glass, and the like. In order to effectively cool the cooling target, it is preferable that the resin material layer has the minimum required thickness. Heat radiation in the atmospheric window increases as the film thickness of the resin material layer is increased, and heat radiation energy in the atmospheric window is saturated when the film thickness exceeds a certain thickness.

Although the film thickness at which heat radiation energy is saturated varies according to the resin material, in the case of a fluorocarbon resin, heat radiation energy is generally sufficiently saturated when the film thickness is 300 μm. Therefore, from the viewpoint of thermal conductivity, it is desirable to set the film thickness to be no greater than 300 μm, rather than 500 μm.

Note that, even when the thickness is about 100 μm, sufficient heat radiation can be obtained in the atmospheric window range although heat radiation is not saturated. The smaller the thickness is, the higher the thermal transmittance becomes and the more effectively the temperature of the cooling target can be reduced, and therefore, in the case of a fluorocarbon resin, the thickness may be set to about 100 μm or less.

Moreover, in the case of a fluorocarbon resin, absorption coefficients of a carbon-silicon bond, a carbon-chlorine bond, a carbon-oxygen bond, an ester bond, and an ether bond are larger than an absorption coefficient of a C—F bond. Naturally, it is desirable to set the film thickness to be no greater than 300 μm, rather than 500 μm from the viewpoint of thermal conductivity, but if the film thickness is further reduced to increase the thermal conductivity, an even greater radiative cooling effect can be expected.

Examples of fluorocarbon resins that can be preferably used include polyvinyl fluoride (PVF) and polyvinylidene fluoride (PVDF). Polyvinyl fluoride (PVF) and polyvinylidene fluoride (PVDF) are flame retardant and unlikely to undergo biodegradation, and therefore can be preferably used as the resin material forming the resin material layer of the radiative cooling device that is used outdoors.

In short, according to the above-described characteristic configuration of the radiative cooling device of the present invention, it is possible to improve the radiative cooling effect in the case where the resin material is a fluorocarbon resin.

In another characteristic configuration of the radiative cooling device of the present invention, a resin material forming the resin material layer has any one or two or more of a carbon-chlorine bond, a carbon-oxygen bond, an ester bond, an ether bond, and a benzene ring, and the resin material layer has a thickness of 50 μm or less.

In the case of a resin material that contains any of a carbon-chlorine bond, a carbon-oxygen bond, an ester bond, an ether bond, and a benzene ring, heat radiation energy in the atmospheric window is saturated even when the thickness is 100 μm, and sufficient heat radiation can be obtained in the atmospheric window range even when the thickness is 50 μm.

The smaller the thickness of the resin material is, the higher the thermal transmittance becomes and the more effectively the temperature of the cooling target can be reduced, and therefore, in the case of a resin containing any of a carbon-chlorine bond, a carbon-oxygen bond, an ester bond, an ether bond, and a benzene ring, it is possible to suppress thermal insulation properties and effectively cool the cooling target by setting the thickness to 50 μm or less.

When the thickness is reduced, it is possible to obtain an effect other than the effect of suppressing thermal insulation properties and facilitating conduction of cold heat. That is, it is possible to suppress light absorption by CH, $CH_2$, and $CH_3$ in the near-infrared range, which occurs in the case of a resin that contains any of a carbon-chlorine bond, a carbon-oxygen bond, an ester bond, and an ether bond. When the thickness is reduced, absorption of sunlight by these can be suppressed and consequently, cooling capability of the radiative cooling device is increased.

From the viewpoint described above, in the case of a resin containing any of a carbon-chlorine bond, a carbon-oxygen bond, an ester bond, an ether bond, and a benzene ring, the radiative cooling effect can be more effectively exhibited under solar radiation when the thickness is 50 μm or less.

In short, according to the above-described characteristic configuration of the radiative cooling device of the present invention, it is possible to improve the radiative cooling effect of a resin material that contains any one or two or more of a carbon-chlorine bond, a carbon-oxygen bond, an ester bond, an ether bond, and a benzene ring.

In another characteristic configuration of the radiative cooling device of the present invention, a resin material forming the resin material layer has a carbon-silicon bond, and the resin material layer has a thickness of 10 μm or less.

In the case of a resin material that has a carbon-silicon bond, heat radiation in the atmospheric window is sufficiently saturated even when the thickness is 50 μm, and sufficient heat radiation can be obtained in the atmospheric window range even when the thickness is 10 μm. The smaller the thickness of the resin material is, the higher the thermal transmittance becomes and the more effectively the temperature of the cooling target can be reduced, and therefore, in the case of a resin material having a carbon-silicon bond, it is possible to suppress thermal insulation properties and effectively cool the cooling target by setting the thickness to 10 μm or less. When the thickness is reduced, absorption of sunlight can be suppressed and consequently, cooling capability of the radiative cooling device is increased.

From the viewpoint described above, in the case of a resin material having a carbon-silicon bond, the radiative cooling effect can be more effectively exhibited under solar radiation when the thickness is 10 μm or less.

In short, according to the above-described characteristic configuration of the radiative cooling device of the present invention, it is possible to improve the radiative cooling effect of a resin material having a carbon-silicon bond.

In another characteristic configuration of the radiative cooling device of the present invention, a resin material forming the resin material layer is a vinyl chloride resin or a vinylidene chloride resin, and the resin material layer has a thickness of 10 μm or more and 100 μm or less.

That is, sufficient heat radiation can be obtained in the atmospheric window range with the use of a vinyl chloride resin (polyvinyl chloride) or a vinylidene chloride resin (polyvinylidene chloride) with a thickness of 10 μm or more and 100 μm or less.

Heat radiation properties of the vinyl chloride resin and the vinylidene chloride resin are slightly inferior to those of a fluorocarbon resin with which a large amount of heat radiation can be obtained in the atmospheric window range, but are superior to those of other resin materials such as silicone rubber, and the vinyl chloride resin and the vinylidene chloride resin are far more inexpensive than the fluorocarbon resin, and therefore are effective to produce, at a low cost, a radiative cooling device whose temperature becomes lower than the ambient temperature in direct sunlight.

Furthermore, a thin film of the vinyl chloride resin or the vinylidene chloride resin is soft, and accordingly is unlikely to be damaged even when another object comes into contact therewith, and therefore, a good appearance of the film can be maintained for a long period of time. Note that a thin film of the fluorocarbon resin is hard, and accordingly is likely to be damaged when another object comes into contact therewith, and therefore, it is difficult to maintain a good appearance of the film. Moreover, the vinyl chloride resin and the vinylidene chloride resin are flame retardant and unlikely to undergo biodegradation, and therefore can be preferably used as the resin material forming the resin material layer of the radiative cooling device that is used outdoors.

In short, according to the above-described characteristic configuration of the radiative cooling device of the present invention, it is possible to obtain a radiative cooling device whose temperature becomes lower than the ambient temperature in direct sunlight and that is unlikely to be damaged.

In another characteristic configuration of the radiative cooling device of the present invention, the light reflective layer is constituted by silver or a silver alloy and has a thickness of 50 nm or more.

In order to make the light reflective layer have the reflectance characteristics described above, i.e., a reflectance of 90% or more for light having a wavelength within a range from 0.4 µm to 0.5 µm and a reflectance of 96% or more for light having a wavelength longer than 0.5 µm, silver or a silver alloy needs to be used as a reflective material that constitutes the radiative surface side portion of the light reflective layer.

In a case where sunlight is to be reflected only by silver or a silver alloy so as to satisfy the reflectance characteristics described above, a thickness of 50 nm or more is required.

In short, according to the characteristic configuration of the radiative cooling device of the present invention, it is possible to appropriately suppress absorption of solar energy by the light reflective layer and allow the resin material layer to favorably perform radiative cooling.

In another characteristic configuration of the radiative cooling device of the present invention, the light reflective layer has a layered structure constituted by silver or a silver alloy disposed adjacent to the protective layer and aluminum or an aluminum alloy disposed apart from the protective layer.

That is, in order to make the light reflective layer have the reflectance characteristics described above, it is also possible to adopt a structure obtained by stacking silver or a silver alloy and aluminum or an aluminum alloy. In this case as well, it is necessary to use silver or a silver alloy as the reflective material disposed on the radiative surface side. In this case, the thickness of silver needs to be 10 nm or more, and the thickness of aluminum needs to be 30 nm or more.

Since aluminum or an aluminum alloy is inexpensive compared with silver or a silver alloy, it is possible to reduce the cost of the light reflective layer while making the light reflective layer have appropriate reflectance characteristics.

That is, it is possible to reduce the cost of the light reflective layer while making the light reflective layer have appropriate reflectance characteristics by adopting a layered structure constituted by silver or a silver alloy and aluminum or an aluminum alloy for the light reflective layer, and reducing the thickness of silver or the silver alloy, which is expensive, to reduce the cost of the light reflective layer.

In short, according to the above-described characteristic configuration of the radiative cooling device of the present invention, it is possible to reduce the cost of the light reflective layer while making the light reflective layer have appropriate reflectance characteristics.

In another characteristic configuration of the radiative cooling device of the present invention, the resin material layer, the protective layer, and the light reflective layer stacked on each other have a film shape.

A laminate of the resin material layer, the protective layer, and the light reflective layer have a film shape. That is, the radiative cooling device formed by stacking the resin material layer, the protective layer, and the light reflective layer is produced as a radiative cooling film.

The resin material layer and the protective layer are flexible, and accordingly, when the light reflective layer is formed as a thin film so as to be flexible, the radiative cooling device (radiative cooling film) has flexibility.

Therefore, it is possible to favorably impart radiative cooling properties to external walls of existing outdoor facilities or the like through post attachment of the film-shaped radiative cooling device (radiative cooling film) having flexibility.

Various forms are conceivable to make the radiative cooling device (radiative cooling film) in a film shape. For example, it is conceivable to apply the protective layer and the resin material layer to the light reflective layer formed in a film shape. Alternatively, it is conceivable to attach the protective layer and the resin material layer to the light reflective layer formed in a film shape. Alternatively, it is conceivable to apply or attach the protective layer to the resin material layer formed in a film shape, and form the light reflective layer on the protective layer through vapor deposition, sputtering, ion plating, a silver mirror reaction, or the like.

In short, according to the above-described characteristic configuration of the radiative cooling device of the present invention, it is possible to favorably impart radiative cooling properties to existing facilities through post attachment of the radiative cooling device.

In another characteristic configuration of the radiative cooling device of the present invention, the resin material layer and the protective layer are joined by a joining layer constituted by an adhesive agent or a pressure-sensitive adhesive agent.

The resin material layer and the protective layer are joined by the joining layer constituted by an adhesive agent or a pressure-sensitive adhesive agent. Accordingly, it is possible to favorably obtain the state where the resin material layer, the protective layer, and the light reflective layer are stacked on each other by forming the light reflective layer and the protective layer in a stacked state and joining the resin material layer, which has been separately formed, to the protective layer using the joining layer.

When durability of the adhesive agent or the pressure-sensitive adhesive agent against a shear force and a tensile force becomes weak, the resin material layer and the protective layer are displaced relative to each other over time due to a difference between coefficients of thermal expansion of the resin material layer and the protective layer. A displaced portion that does not include the resin material layer serving as the infrared radiative layer loses radiative cooling properties. Moreover, the joining layer is exposed in the displaced portion, and therefore, various types of degradation start from that portion. As described above, degradation caused by a shear force or a tensile force is a degradation mode that should not happen. When the joining layer is thick, durability against a shear force and a tensile force becomes weak. That is, creep properties of the resin material layer and the protective layer become worse. From this viewpoint, a thin joining layer having a thickness of 150 µm or less is desirable. However, when the joining layer is too thin, strength against an impact that causes peeling becomes weak and the resin material layer and the protective layer are easily peeled off, and therefore, the joining layer needs to have a thickness of 1 µm or more. The thickness of the joining layer should not be increased unnecessarily because the thermal conductivity decreases as the thickness of the joining layer is increased. Therefore, it is desirable that the joining layer has a thickness of 100 µm or less.

As described above, it is desirable that the thickness of the joining layer is 1 µm or more and 100 µm or less. In order to reduce the thickness of the joining layer while improving creep resistance of the joining layer and its strength against an impact that causes peeling, it is necessary to increase the degree of polymerization of a resin forming the joining layer. When the degree of polymerization is increased, the resin becomes hard and its flexibility decreases. From the viewpoint of workability of a radiative cooling raw material (radiative cooling device), flexibility and stretchability of the raw material are important, and therefore, it is more desirable that the thickness of the joining layer is 1 µm or more and 50 µm or less.

In the case where the joining layer is disposed between the resin material layer and the protective layer, radicals are generated in the joining layer as well, but it is possible to keep the radicals generated in the joining layer from reaching the light reflective layer for a long period of time if the thickness of a polyolefin based resin forming the protective layer is 300 nm or more or the thickness of an ethylene terephthalate resin forming the protective layer is 17 µm or more.

In another characteristic configuration of the radiative cooling device of the present invention, a filler constituted by an inorganic material is mixed in the resin material layer.

It is possible to provide the resin material layer with a light scattering configuration by mixing a filler constituted by an inorganic material in the resin material layer.

With the light scattering configuration, it is possible to suppress a glare on the radiative surface when the radiative surface is seen.

As the inorganic material constituting the filler, silicon dioxide ($SiO_2$), titanium oxide ($TiO_2$), aluminum oxide ($Al_2O_3$), magnesium oxide (MgO), and the like can be preferably used. When the filler is mixed in the resin material layer, irregularities are formed on both of front and rear surfaces of the resin material layer.

Since the joining layer is disposed between the resin material layer and the protective layer, the resin material layer and the protective layer can be joined appropriately by the joining layer even if irregularities are formed on the rear surface of the resin material layer.

In short, according to the above-described characteristic configuration of the radiative cooling device of the present invention, it is possible to suppress a glare on the radiative surface and appropriately join the resin material layer and the protective layer.

In another characteristic configuration of the radiative cooling device of the present invention, irregularities are formed on both of front and rear surfaces of the resin material layer.

It is possible to provide the resin material layer with a light scattering configuration by forming irregularities on both of the front and rear surfaces of the resin material layer.

With the light scattering configuration, it is possible to suppress a glare on the radiative surface when the radiative surface is seen.

Irregularities can be formed on both of the front and rear surfaces of the resin material layer through embossing processing, processing for scarring the surfaces, or the like.

Since the joining layer is disposed between the resin material layer and the protective layer, the resin material layer and the protective layer can be joined appropriately by the joining layer even if irregularities are formed on the rear surface of the resin material layer.

In short, according to the above-described characteristic configuration of the radiative cooling device of the present invention, it is possible to suppress a glare on the radiative surface and appropriately join the resin material layer and the protective layer.

A radiative cooling method according to the present invention is a radiative cooling method in which the radiative cooling device having any of the above-described characteristic configurations is used to radiate the infrared light from the radiative surface disposed on a side opposite to the light reflective layer side surface of the resin material layer, and the radiative cooling method is characterized by orienting the radiative surface toward the sky to allow the radiative surface to radiate the infrared light.

With this configuration, infrared light that is released from the radiative surface to the outside of the system can be emitted toward the sky, i.e., the universe. Furthermore, it is possible to suppress absorption of sunlight and improve cooling performance.

In short, according to this characteristic configuration of the radiative cooling method of the present invention, it is possible to improve cooling performance while suppressing absorption of sunlight.

BRIEF DESCRIPTION OF THE DRAWINGS

FIG. 15 is a table showing experimental results.

FIG. 16 is a diagram showing a specific configuration of the radiative cooling device.

FIG. 17 is a diagram showing a specific configuration of the radiative cooling device.

DESCRIPTION OF THE INVENTION

The following describes an embodiment of the present invention based on the drawings.

[Basic Configuration of Radiative Cooling Device]

Figure 1:
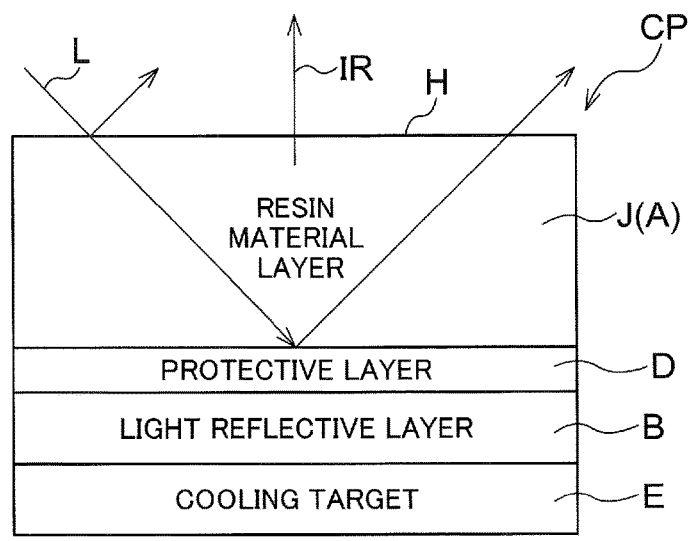
FIG. 1 is a diagram showing a basic configuration of a radiative cooling device.

As shown in FIG. 1, a radiative cooling device CP includes an infrared radiative layer A that radiates infrared light IR from a radiative surface H, a light reflective layer B that is disposed on the side opposite to the radiative surface H with respect to the infrared radiative layer A, and a protective layer D that is disposed between the infrared radiative layer A and the light reflective layer B. The infrared radiative layer A, the light reflective layer B, and the protective layer D are stacked on each other, and the radiative cooling device CP has a film shape.

That is, the radiative cooling device CP is configured as a radiative cooling film.

The light reflective layer B reflects light L, such as sunlight, that has been transmitted through the infrared radiative layer A and the protective layer D, and has reflection properties satisfying a reflectance of 90% or more for light having a wavelength within a range from 400 nm to 500 nm and a reflectance of 96% or more for light having a wavelength longer than 500 nm.

Figure 10:
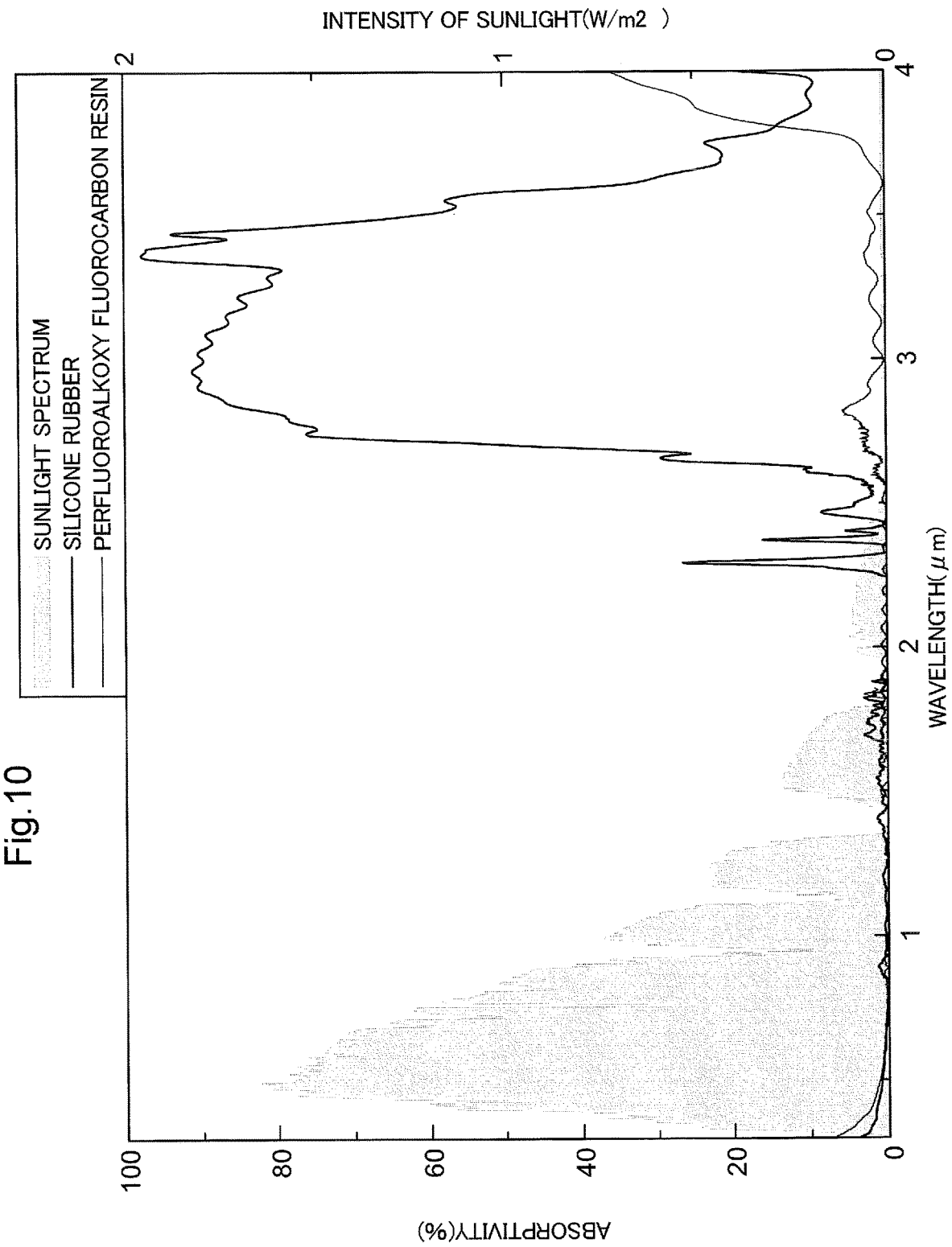
FIG. 10 is a diagram showing absorptivity spectrums of silicone rubber and a perfluoroalkoxy fluorocarbon resin.

As shown in FIG. 10, the spectrum of sunlight spans from a wavelength of 300 nm to a wavelength of 4000 nm, and the intensity increases as the wavelength increases from 400 nm, and the intensity is particularly high in a wavelength range from 500 nm to 1800 nm.

In the present embodiment, light L encompasses ultraviolet light (ultraviolet rays), visible light, and infrared light. When these are described in terms of the wavelength of light, which is electromagnetic waves, the light L encompasses electromagnetic waves having wavelengths of 10 nm to 20000 nm (electromagnetic waves having wavelengths of 0.01 µm to 20 µm). In the present specification, the wavelength range of ultraviolet light (ultraviolet rays) is taken as a range from 300 nm to 400 nm.

Since the light reflective layer B exhibits the reflection properties satisfying a reflectance of 90% or more for light having a wavelength within a range from 400 nm to 500 nm and a reflectance of 96% or more for light having a wavelength longer than 500 nm, solar energy absorbed by the light reflective layer B of the radiative cooling device CP (radiative cooling film) can be suppressed to 5% or less. That is, solar energy absorbed at the time of meridian transit in summer can be suppressed to about 50 W.

The light reflective layer B is constituted by silver or a silver alloy or has a layered structure constituted by silver or a silver alloy disposed adjacent to the protective layer D and aluminum or an aluminum alloy disposed apart from the protective layer D, and is flexible. Details of the light reflective layer B will be described later.

The infrared radiative layer A is configured as a resin material layer J that has a thickness adjusted so as to emit heat radiation energy greater than absorbed solar energy in a wavelength band from 8 µm to 14 µm. Details of the infrared radiative layer A will be described later.

Accordingly, the radiative cooling device CP is configured such that the radiative surface H of the infrared radiative layer A reflects a portion of light L incident on the radiative cooling device CP and the light reflective layer B reflects a portion (e.g., sunlight) of light L incident on the radiative cooling device CP and transmitted through the resin material layer J and the protective layer D so that the reflected light goes out from the radiative surface H to the outside.

The radiative cooling device CP is also configured to cool a cooling target E that is disposed on the side opposite to the resin material layer J with respect to the light reflective layer B by converting heat input from the cooling target E to the radiative cooling device CP (e.g., heat conducted from the cooling target E) to infrared light IR in the resin material layer J and radiating the infrared light IR from the resin material layer J.

That is, the radiative cooling device CP is configured to reflect light L emitted toward the radiative cooling device CP and radiate heat conducted to the radiative cooling device CP (e.g., heat conducted from the atmosphere or the cooling target E) as infrared light IR to the outside.

Also, the radiative cooling device CP (radiative cooling film) is configured to be flexible due to the resin material layer J, the protective layer D, and the light reflective layer B being flexible.

In addition, the radiative cooling device CP is used to perform a radiative cooling method of radiating infrared light IR from the radiative surface H disposed on the side opposite to a surface of the resin material layer J that is in contact with the light reflective layer B. Specifically, the radiative cooling method is performed by orienting the radiative surface H toward the sky to allow the radiative surface H facing the sky to radiate infrared light IR.

[Overview of Resin Material Layer]

The absorptivity and the emissivity (light emissivity) of a resin material that forms the resin material layer J vary according to the thickness of the resin material layer J. Therefore, the thickness of the resin material layer J needs to be adjusted so as not to absorb sunlight as far as possible and so as to radiate a large amount of heat in the wavelength band of so-called atmospheric window (wavelength band from 8 μm to 14 μm).

Specifically, from the viewpoint of absorptivity for sunlight, the thickness of the resin material layer J needs to be adjusted such that a wavelength average absorptivity in a wavelength range from 0.4 μm to 0.5 μm is 13% or less, a wavelength average absorptivity in a wavelength range from 0.5 μm to 0.8 μm is 4% or less, a wavelength average absorptivity in a wavelength range from 0.8 μm to 1.5 μm is 1% or less, a wavelength average absorptivity in a wavelength range from 1.5 μm to 2.5 μm is 40% or less, and a wavelength average absorptivity in a wavelength range from 2.5 μm to 4 μm is 100% or less.

In the case of such an absorptivity distribution, the absorptivity for sunlight is 10% or less, which corresponds to an energy of 100 W or less.

The absorptivity of a resin material increases as the film thickness of the resin material is increased, as described later. When a film of the resin material is made thick, the emissivity in the atmospheric window becomes approximately 1, and the amount of heat radiated to the universe at that time is 125 W/m² to 160 W/m². The amount of sunlight absorbed by the protective layer D and the light reflective layer B is 50 W/m² or less. Cooling progresses if the sum of amounts of sunlight absorbed by the resin material layer J, the protective layer D, and the light reflective layer B is 150 W/m² or less and the atmosphere is in good conditions. As the resin material for forming the resin material layer J, it is preferable to use a resin material that has a small absorptivity in the vicinity of a peak value of the sunlight spectrum as described above.

Also, from the viewpoint of infrared radiation (heat radiation), the thickness of the resin material layer J needs to be adjusted such that a wavelength average emissivity in the wavelength range from 8 μm to 14 μm is 40% or more.

In order to emit heat energy of about 50 W/m² absorbed from sunlight by the protective layer D and the light reflective layer B through heat radiation from the resin material layer J to the universe, the resin material layer J needs to radiate heat more than or equal to the absorbed heat.

For example, when the ambient temperature is 30° C., the maximum heat radiation in the atmospheric window of 8 μm to 14 μm is 200 W/m² (calculated with the emissivity taken as 1). This value can be obtained in an environment in which the air is thin and very dry, such as an environment on a high mountain, in cloudless weather. When compared with a high mountain, the thickness of the atmosphere increases in a lowland, for example, and accordingly, the wavelength band of the atmospheric window becomes narrower and the transmittance decreases. This is said as "the atmospheric window becoming narrower".

Also, the radiative cooling device CP (radiative cooling film) is actually used in a humid environment, and the atmospheric window becomes narrower in such a case as well. In the case where the radiative cooling device is used in a lowland, heat radiation in the atmospheric window band is estimated to be 160 W/m² (calculated with the emissivity taken as 1) at 30° C. under good conditions. Moreover, when there is haze or smog in the sky, as is often the case in Japan, the atmospheric window further becomes narrower and radiation to the universe becomes about 125 W/m².

In view of the foregoing, the radiative cooling device cannot be used in a lowland in the mid-latitude area unless the wavelength average emissivity in the wavelength range from 8 μm to 14 μm is 40% or more (heat radiation intensity in the atmospheric window band is 50 W/m²).

Therefore, when the thickness of the resin material layer J is adjusted so as to fall within the range of optical prescriptions in view of the foregoing, the amount of heat output in the atmospheric window becomes greater than the amount of heat input through absorption of sunlight, and the temperature can be made lower than the ambient temperature through radiative cooling even under solar radiation in an outdoor environment.

[Details of Resin Material]

It is possible to use colorless resin materials that have any of a carbon-fluorine bond (C—F), a siloxane bond (Si—O—Si), a carbon-chlorine bond (C—Cl), a carbon-oxygen bond (C—O), an ester bond (R—COO—R), an ether bond (C—O—C bond), and a benzene ring.

Figure 2:
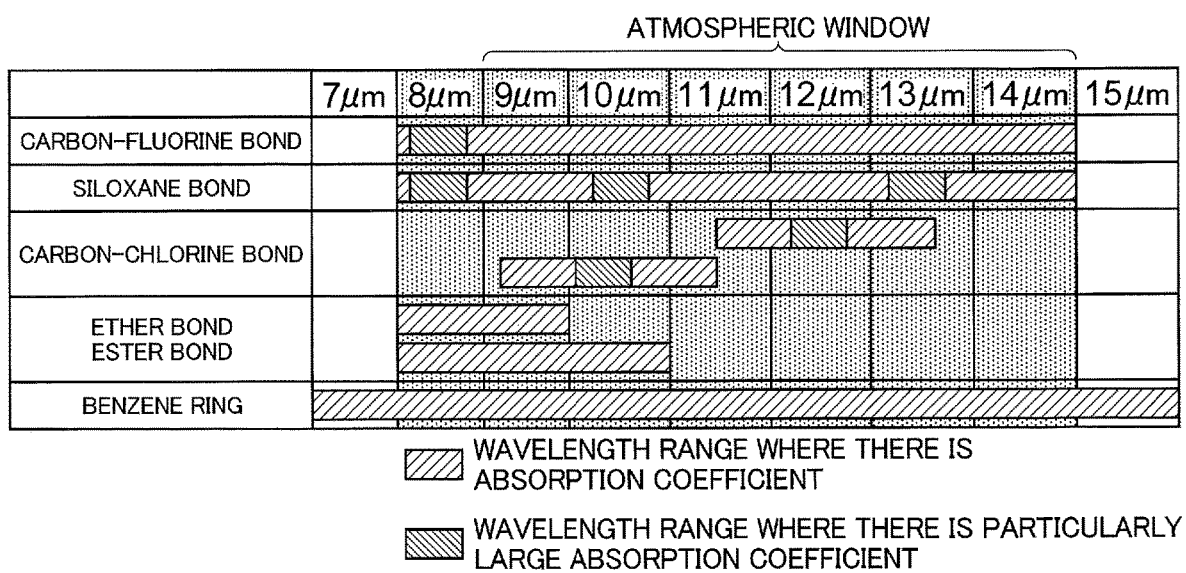
FIG. 2 is a diagram showing a relationship between absorption coefficients of resin materials and wavelength bands.

For each resin material (except for a resin material having a carbon-oxygen bond), FIG. 2 shows a wavelength range in which the resin material has an absorption coefficient in the wavelength band of the atmospheric window.

According to Kirchhoff's law, the emissivity ($\varepsilon$) is equal to the absorptivity (A). The absorptivity can be determined from an absorption coefficient ($\alpha$) and a relational expression: $A=1-\exp(-\alpha t)$ (hereinafter referred to as an absorptivity relational expression). Note that t represents a film thickness.

That is, by adjusting the film thickness of the resin material layer J, it is possible to obtain a large amount of heat radiation in a wavelength band in which the absorption coefficient is large. In a case where radiative cooling is performed outdoors, it is preferable to use a material that has a large absorption coefficient in the wavelength band of the atmospheric window, which is from 8 μm to 14 μm.

Also, in order to suppress absorption of sunlight, it is preferable to use a material that does not have an absorption coefficient or has a small absorption coefficient in a wavelength range from 0.3 μm to 4 μm, and particularly from 0.4 μm to 2.5 μm. As can be understood from the relational expression of the absorption coefficient and the absorptivity, the absorptivity (emissivity) varies according to the film thickness of the resin material.

In order to make the temperature lower than the temperature of the surrounding atmosphere through radiative cooling under solar radiation, it is possible to create a state in which almost no sunlight is absorbed but a large amount of heat is radiated in the atmospheric window, i.e., output of radiative cooling is greater than input of sunlight, by selecting a material that has a large absorption coefficient in the wavelength band of the atmospheric window and almost no absorption coefficient in the wavelength band of sunlight and by adjusting the film thickness.

As for the carbon-fluorine bond (C—F), absorption coefficients of CHF and $CF_2$ are widely spread in the wide wavelength band from 8 μm to 14 μm, which is the atmospheric window, and an absorption coefficient at 8.6 μm is particularly large. Regarding the wavelength band of sunlight, there is no noticeable absorption coefficient in the wavelength range from 0.3 μm to 2.5 μm in which the energy intensity is high.

Examples of resin materials that have a carbon-fluorine bond (C—F) include:

- polytetrafluoroethylene (PTFE), which is a fully fluorinated resin;
- polychlorotrifluoroethylene (PCTFE), polyvinylidene fluoride (PVDF), and polyvinyl fluoride (PVF), which are partially fluorinated resins;
- a perfluoroalkoxy fluorocarbon resin (PFA), which is a fluorinated resin copolymer;
- a tetrafluoroethylene-hexafluoropropylene copolymer (FEP);
- an ethylene-tetrafluoroethylene copolymer (ETFE); and
- an ethylene-chlorotrifluoroethylene copolymer (ECTFE).

Examples of resin materials that have a siloxane bond (Si—O—Si) include silicone rubber and a silicone resin.

In the cases of these resins, a large absorption coefficient for stretching of C—Si bonds appears broadly around a wavelength of 13.3 μm, an absorption coefficient for out-of-plane bending (wagging) of $CSiH_2$ appears broadly around a wavelength of 10 μm, and an absorption coefficient for in-plane bending (scissoring) of $CSiH_2$ slightly appears in the vicinity of a wavelength of 8 μm.

As for the carbon-chlorine bond (C—Cl), an absorption coefficient for stretching vibration of C—Cl appears around a wavelength of 12 μm over a wide range with a half width of 1 μm or more.

Examples of resin materials that have a carbon-chlorine bond include a vinyl chloride resin (PVC) and a vinylidene chloride resin (PVDC). In the case of the vinyl chloride resin, an absorption coefficient for bending vibration of C—H in an alkene contained in the main chain appears at a wavelength of about 10 μm under the influence of electron-withdrawing of chlorine.

The ester bond (R—COO—R) and the ether bond (C—O—C bond) have absorption coefficients in a wavelength range from 7.8 μm to 9.9 μm. As for a carbon-oxygen bond included in the ester bond and the ether bond, a large absorption coefficient appears in a wavelength range from 8 μm to 10 μm.

When a benzene ring is introduced into a side chain of a hydrocarbon resin, absorption appears broadly in a wavelength range from 8.1 μm to 18 μm due to vibration of the benzene ring itself and vibration of surrounding elements under the influence of the benzene ring.

Examples of resins that have these bonds include a methyl methacrylate resin, an ethylene terephthalate resin, a trimethylene terephthalate resin, a butylene terephthalate resin, an ethylene naphthalate resin, and a butylene naphthalate resin.

[Consideration on Light Absorption]

The following is consideration on absorption of light in the ultraviolet-visible range, i.e., absorption of sunlight by resin materials having the above-described bonds and functional group. The origin of absorption of ultraviolet light and visible light is transition of electrons that contribute to bonds. Absorption of light in this wavelength range can be found by calculating bond energy.

First, the following considers wavelengths at which resin materials having a carbon-fluorine bond (C—F) have an absorption coefficient in the ultraviolet-visible range. When polyvinylidene fluoride (PVDF) is taken as a representative example, bond energies of a C—C bond, a C—H bond, and a C—F bond in the basic structural unit are 4.50 eV, 4.46 eV, and 5.05 eV. These energies correspond to a wavelength of 0.275 μm, a wavelength of 0.278 μm, and a wavelength of 0.246 μm, respectively, and the resin absorbs light having these wavelengths.

Since the sunlight spectrum includes only wavelengths longer than 0.300 μm, when a fluorocarbon resin is used, the resin absorbs almost no ultraviolet rays, visible rays, and near-infrared rays of sunlight. Note that ultraviolet rays are defined as light having a wavelength shorter than 0.400 μm, visible rays are defined as light in a wavelength range from 0.400 μm to 0.800 μm, near-infrared rays are defined as light in a wavelength range from 0.800 μm to 3 μm, mid-infrared rays are defined as light in a wavelength range from 3 μm to 8 μm, and far-infrared rays are defined as light having a wavelength longer than 8 μm.

Figure 3:
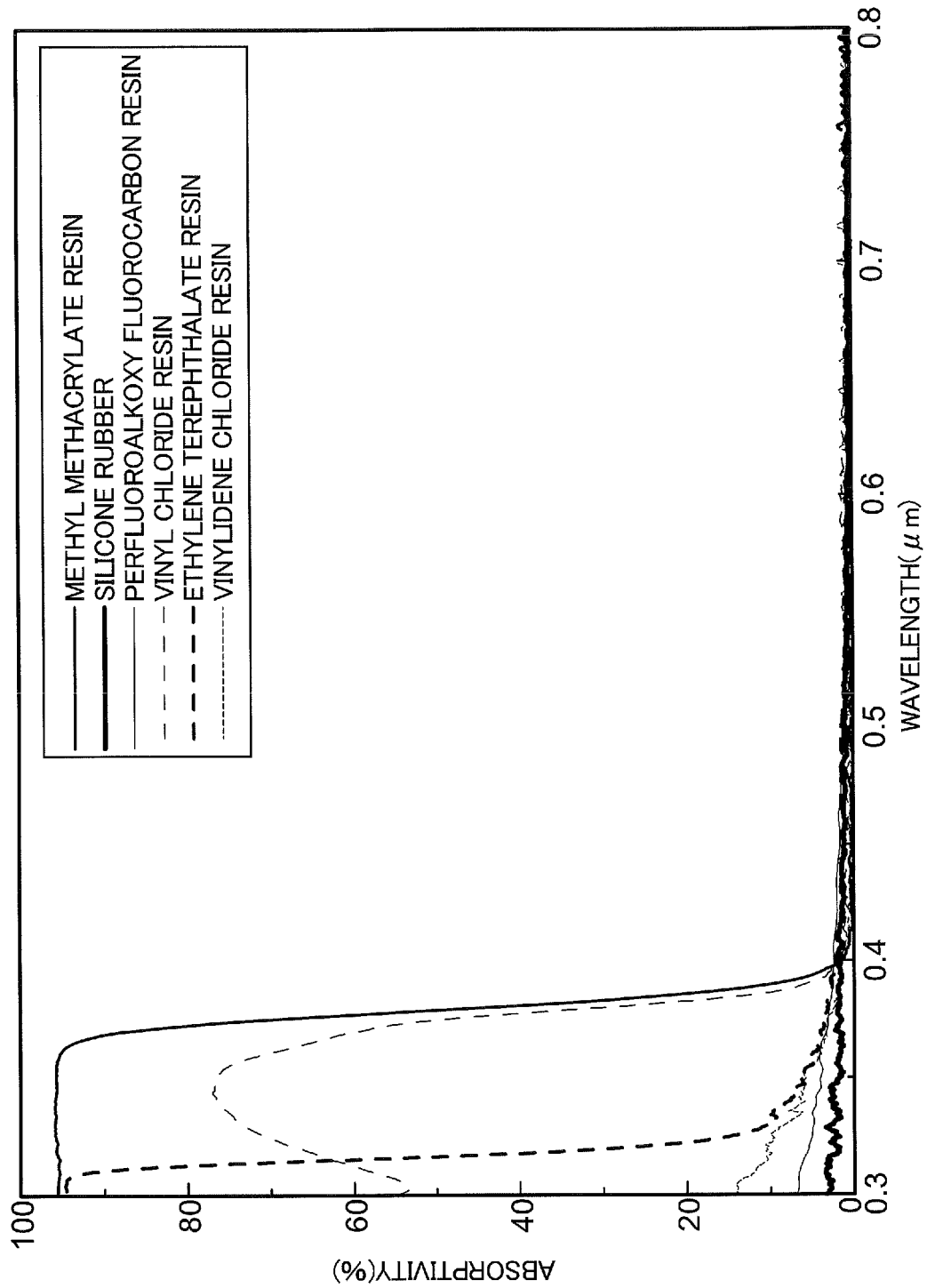
FIG. 3 is a diagram showing a relationship between absorptivities of resin materials and the wavelength.

FIG. 3 shows an absorptivity spectrum of PFA (perfluoroalkoxy fluorocarbon resin) with a thickness of 50 μm in the ultraviolet-visible range. It can be found that PFA has almost no absorptivity in this range. Although a slight increase can be observed in the absorptivity spectrum at wavelengths shorter than 0.4 μm, this increase shows an influence of scattering in the sample used for the measurement, and the absorptivity does not actually increase.

As for absorption by the siloxane bond (Si—O—Si) in the ultraviolet range, bond energy of Si—O—Si constituting the main chain is 4.60 eV, which corresponds to a wavelength of 269 nm. Since the sunlight spectrum includes only wavelengths longer than 0.300 μm, when the siloxane bond constitutes the most part of the resin material, the resin material absorbs almost no ultraviolet rays, visible rays, and near-infrared rays of sunlight.

FIG. 3 shows an absorptivity spectrum of silicone rubber with a thickness of 100 μm in the ultraviolet-visible range. It can be found that silicone rubber has almost no absorptivity in this range. Although a slight increase can be observed in the absorptivity spectrum at wavelengths shorter than 0.4 μm, this increase shows an influence of scattering in the sample used for the measurement, and the absorptivity does not actually increase.

As for the carbon-chlorine bond (C—Cl), bond energy between carbon and chlorine in an alkene is 3.28 eV, which corresponds to a wavelength of 0.378 μm, and therefore, ultraviolet rays in sunlight are absorbed well, but almost no light in the visible range is absorbed.

FIG. 3 shows an absorptivity spectrum of a vinyl chloride resin with a thickness of 100 μm in the ultraviolet-visible range. Light absorption is large at wavelengths shorter than 0.38 μm.

FIG. 3 shows an absorptivity spectrum of a vinylidene chloride resin with a thickness of 100 μm in the ultraviolet-visible range. A slight increase can be observed in the absorptivity spectrum at wavelengths shorter than 0.4 μm.

Examples of resins that have any of an ester bond (R—COO—R), an ether bond (C—O—C bond), and a benzene ring include a methyl methacrylate resin, an ethylene terephthalate resin, a trimethylene terephthalate resin, a butylene terephthalate resin, an ethylene naphthalate resin, and a butylene naphthalate resin. For example, bond energy of a C—C bond in an acrylic resin is 3.93 eV and the resin absorbs sunlight having a wavelength shorter than 0.315 μm, but absorbs almost no light in the visible range.

FIG. 3 shows an absorptivity spectrum of a methyl methacrylate resin with a thickness of 5 mm, as an example of resin materials having the above-described bonds and functional group, in the ultraviolet-visible range. Note that the methyl methacrylate resin described as an example is a commercially available resin in which a benzotriazole ultraviolet absorbing agent is mixed.

Since the thickness is as large as 5 mm, the absorptivity is large even at wavelengths at which the absorption coefficient is small, and light absorption is large at wavelengths shorter than 0.38 µm, which is longer than 0.315 µm.

FIG. 3 shows an absorptivity spectrum of an ethylene terephthalate resin with a thickness of 40 µm, as an example of resin materials having the above-described bonds and functional group, in the ultraviolet-visible range.

As shown in FIG. 3, the absorptivity increases as the wavelength gets closer to 0.315 µm, and the absorptivity sharply increases at the wavelength of 0.315 µm. In the case of the ethylene terephthalate resin as well, when the thickness is increased, the absorptivity becomes large at a wavelength slightly longer than 0.315 µm due to an absorption edge of a C—C bond, and the absorptivity for ultraviolet rays becomes large as is the case with the commercially available methyl methacrylate resin.

The resin material layer J may be any of a single-layer film made of a single resin material, a multilayer film made of a plurality of resin materials, a single-layer film made of a blend of a plurality of resin materials, and a multilayer film made of blends of a plurality of resin materials, as long as resin materials having the above-described characteristics of the emissivity (light emissivity) and the absorptivity are used.

Note that a blend encompasses copolymers such as an alternating copolymer, a random copolymer, a block copolymer, and a graft copolymer, and a modified product obtained by substituting a side chain.

[Emissivity of Silicone Rubber]

Figure 4:
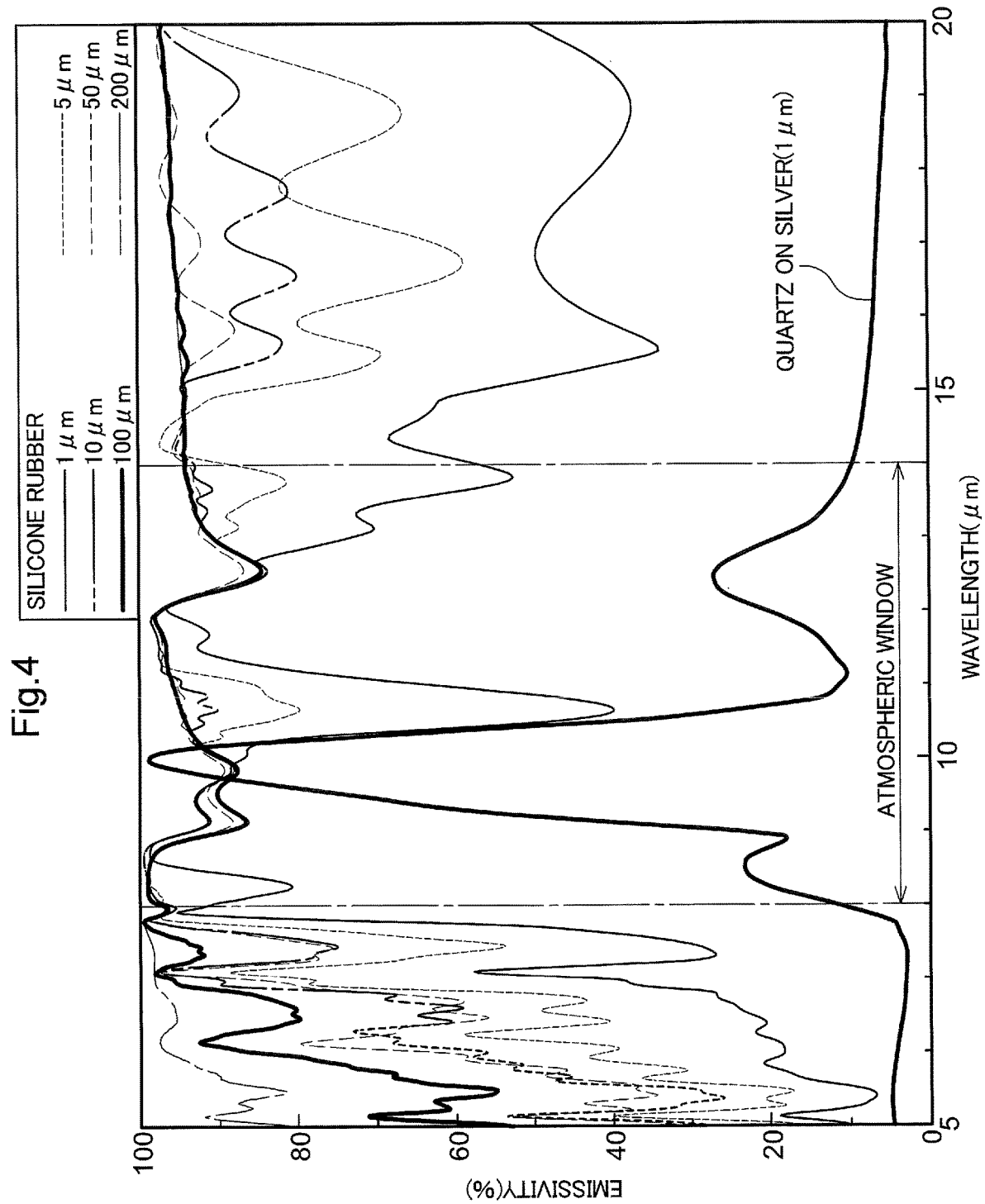
FIG. 4 is a diagram showing an emissivity spectrum of silicone rubber.

FIG. 4 shows an emissivity spectrum of silicone rubber, which has a siloxane bond, in the atmospheric window.

As for silicone rubber, a large absorption coefficient for stretching of C—Si bonds appears broadly around a wavelength of 13.3 µm, an absorption coefficient for out-of-plane bending (wagging) of $CSiH_2$ appears broadly around a wavelength of 10 µm, and an absorption coefficient for in-plane bending (scissoring) of $CSiH_2$ slightly appears in the vicinity of a wavelength of 8 µm.

Under the influence of this, a wavelength average emissivity when the thickness is 1 µm is 80% in the wavelength range from 8 µm to 14 µm and falls within the prescribed range of the wavelength average emissivity of 40% or more. As shown in FIG. 4, the emissivity in the atmospheric window range increases as the film thickness is increased.

FIG. 4 also shows a radiation spectrum of a case where quartz, which is an inorganic material, with a thickness of 1 µm is present on silver. When the thickness is 1 µm, quartz only has a narrow radiation peak in the wavelength range from 8 µm to 14 µm.

When a wavelength average of the heat radiation in the wavelength range from 8 µm to 14 µm is calculated, the emissivity in the wavelength range from 8 µm to 14 µm is 32%, and it is difficult to exhibit radiative cooling properties.

The radiative cooling device CP (radiative cooling film) according to the present invention in which the resin material layer J is used can have radiative cooling properties even if the infrared radiative layer A is thinner than that of conventional technologies in which inorganic materials are used as the light reflective layer B. That is, in a case where the infrared radiative layer A is formed from quartz or TEMPAX glass, which are inorganic materials, radiative cooling properties cannot be obtained if the film thickness of the infrared radiative layer A is 1 µm, but the radiative cooling device CP according to the present invention in which the resin material layer J is used exhibits radiative cooling properties even if the film thickness of the resin material layer J is 1 µm.

[Emissivity of PFA]

Figure 5:
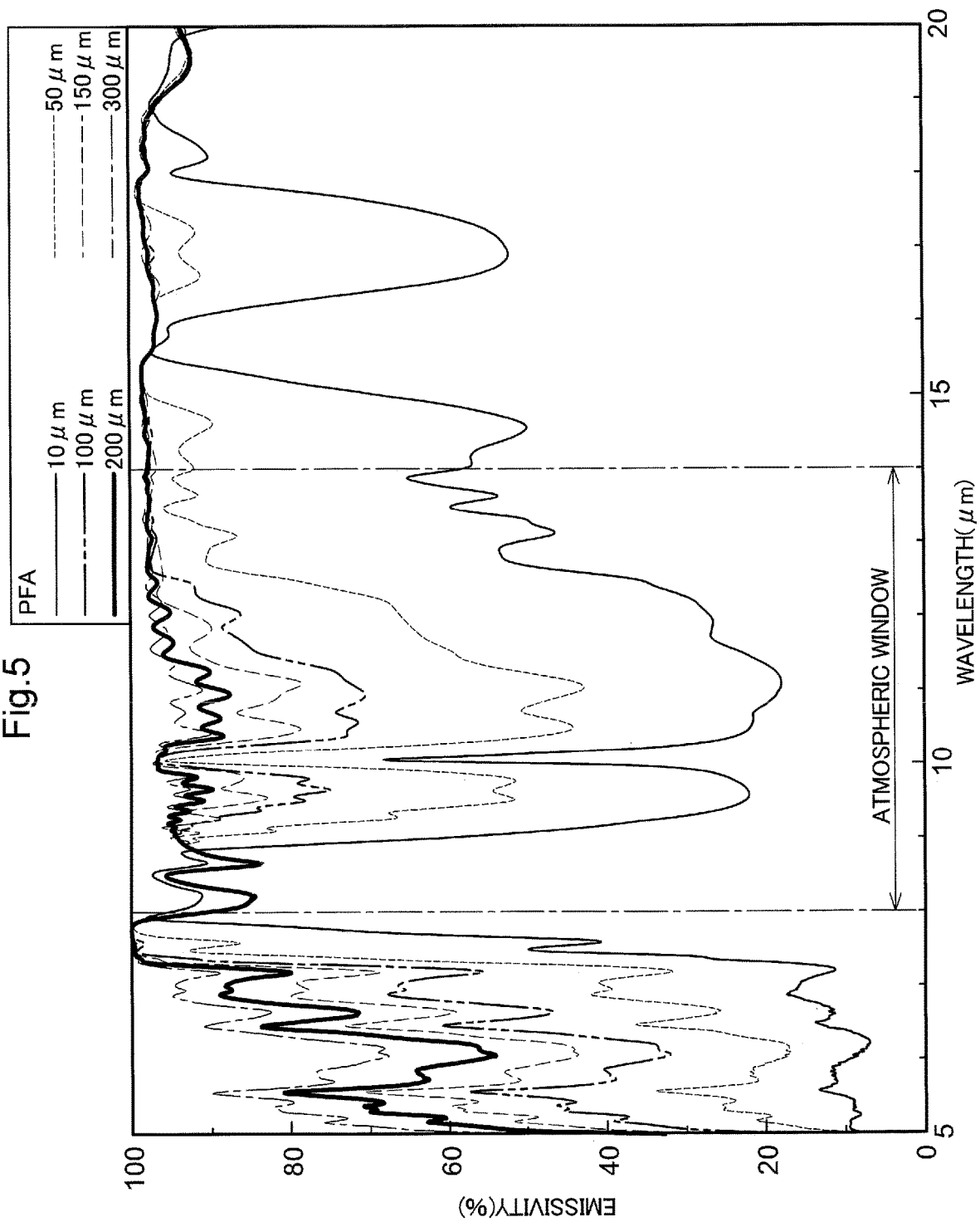
FIG. 5 is a diagram showing an emissivity spectrum of PFA.

FIG. 5 shows the emissivity of a perfluoroalkoxy fluorocarbon resin (PFA), which is a representative example of resins having a carbon-fluorine bond, in the atmospheric window. Absorption coefficients of CHF and $CF_2$ are widely spread in the wide wavelength band from 8 µm to 14 µm, which is the atmospheric window, and an absorption coefficient at 8.6 µm is particularly large.

Under the influence of this, a wavelength average emissivity when the thickness is 10 µm is 45% in the wavelength range from 8 µm to 14 µm and falls within the prescribed range of the wavelength average emissivity of 40% or more. As shown in FIG. 5, the emissivity in the atmospheric window range increases as the film thickness is increased.

[Emissivities of Vinyl Chloride Resin and Vinylidene Chloride Resin]

Figure 6:
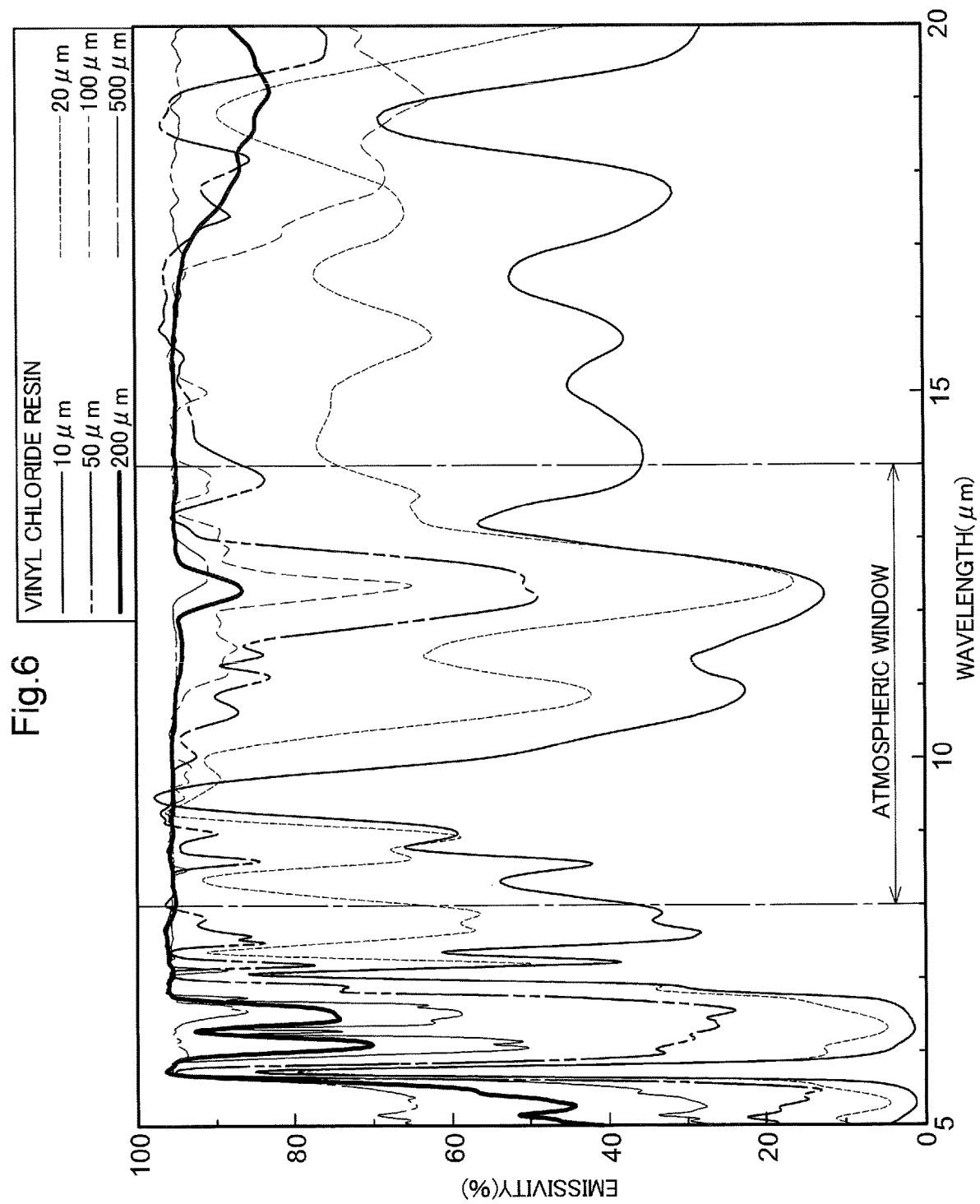
FIG. 6 is a diagram showing an emissivity spectrum of a vinyl chloride resin.
Figure 14:
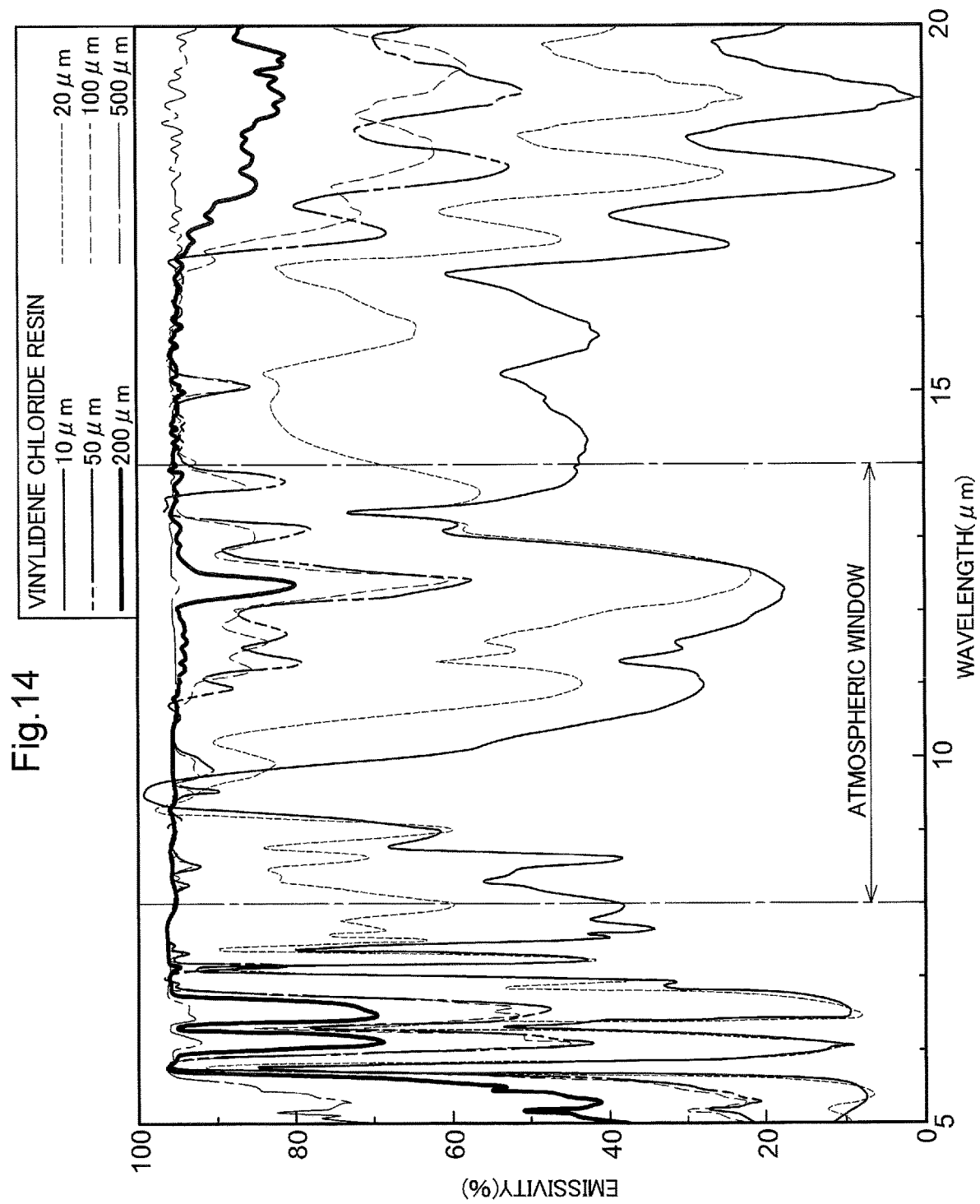
FIG. 14 is a diagram showing an emissivity spectrum of a vinylidene chloride resin.

FIG. 6 shows the emissivity of a vinyl chloride resin (PVC), which is a representative example of resins having a carbon-chlorine bond, in the atmospheric window. Also, FIG. 14 shows the emissivity of a vinylidene chloride resin (PVDC) in the atmospheric window.

As for the carbon-chlorine bond, an absorption coefficient for stretching vibration of C—Cl appears around a wavelength of 12 µm over a wide range with a half width of 1 µm or more.

Also, in the case of the vinyl chloride resin, an absorption coefficient for bending vibration of C—H in an alkene contained in the main chain appears at a wavelength of about 10 µm under the influence of electron-withdrawing of chlorine. This also applies to the vinylidene chloride resin.

Under the influence of these, a wavelength average emissivity when the thickness is 10 µm is 43% in the wavelength range from 8 µm to 14 µm and falls within the prescribed range of the wavelength average emissivity of 40% or more. As shown in FIGS. 6 and 14, the emissivity in the atmospheric window range increases as the film thickness is increased.

[Ethylene Terephthalate Resin]

Figure 7:
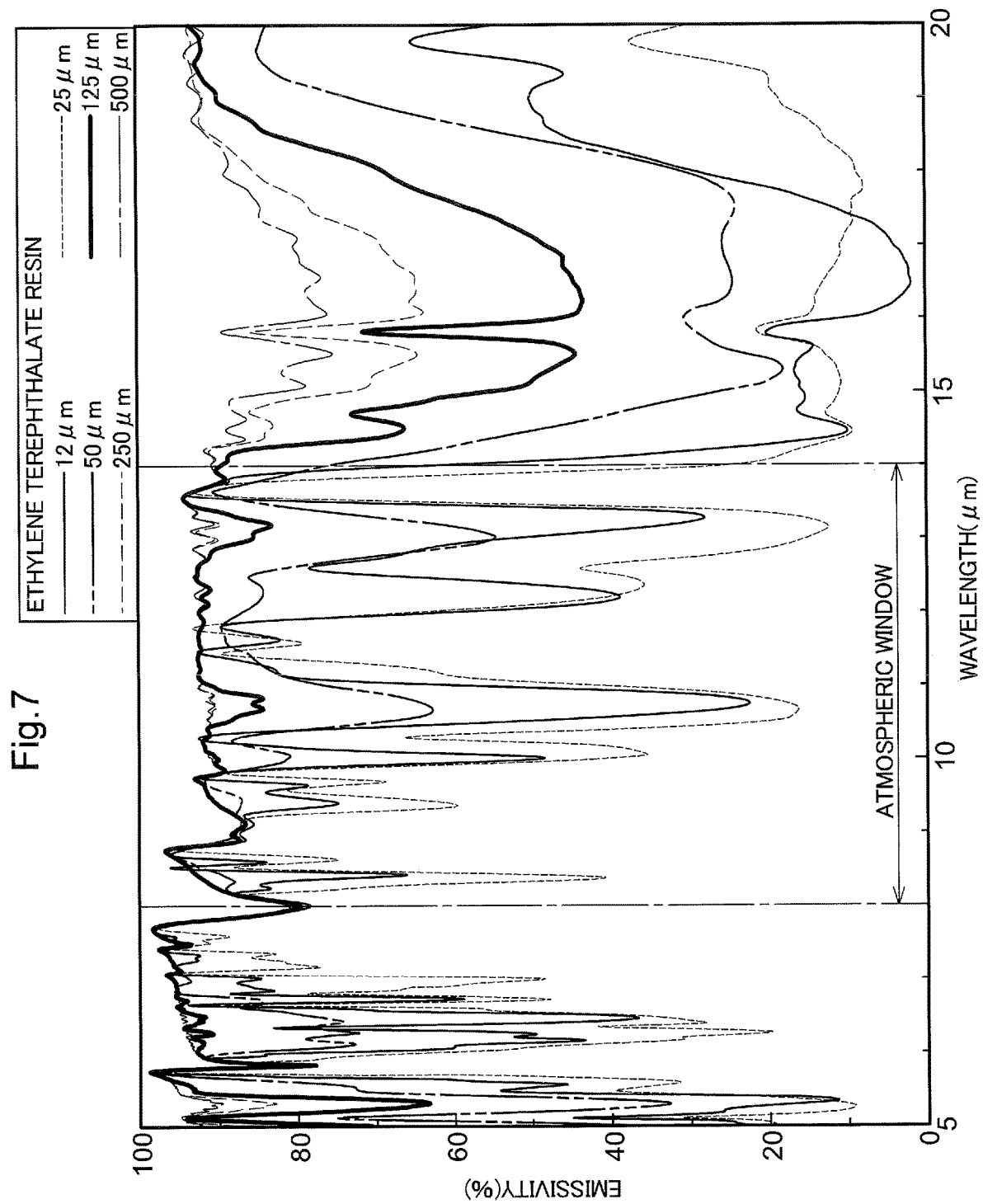
FIG. 7 is a diagram showing an emissivity spectrum of an ethylene terephthalate resin.

FIG. 7 shows the emissivity of an ethylene terephthalate resin, which is a representative example of resins having an ester bond or a benzene ring, in the atmospheric window.

An ester bond has an absorption coefficient in a wavelength range from 7.8 µm to 9.9 µm. As for a carbon-oxygen bond included in the ester bond, a large absorption coefficient appears in a wavelength range from 8 µm to 10 µm. When a benzene ring is introduced into a side chain of a hydrocarbon resin, absorption appears broadly in a wavelength range from 8.1 µm to 18 µm due to vibration of the benzene ring itself and vibration of surrounding elements under the influence of the benzene ring.

Under the influence of these, a wavelength average emissivity when the thickness is 10 µm is 71% in the wavelength range from 8 µm to 14 µm and falls within the prescribed range of the wavelength average emissivity of 40% or more. As shown in FIG. 7, the emissivity in the atmospheric window range increases as the film thickness is increased.

[Emissivity of Modified Olefin Material]

Figure 8:
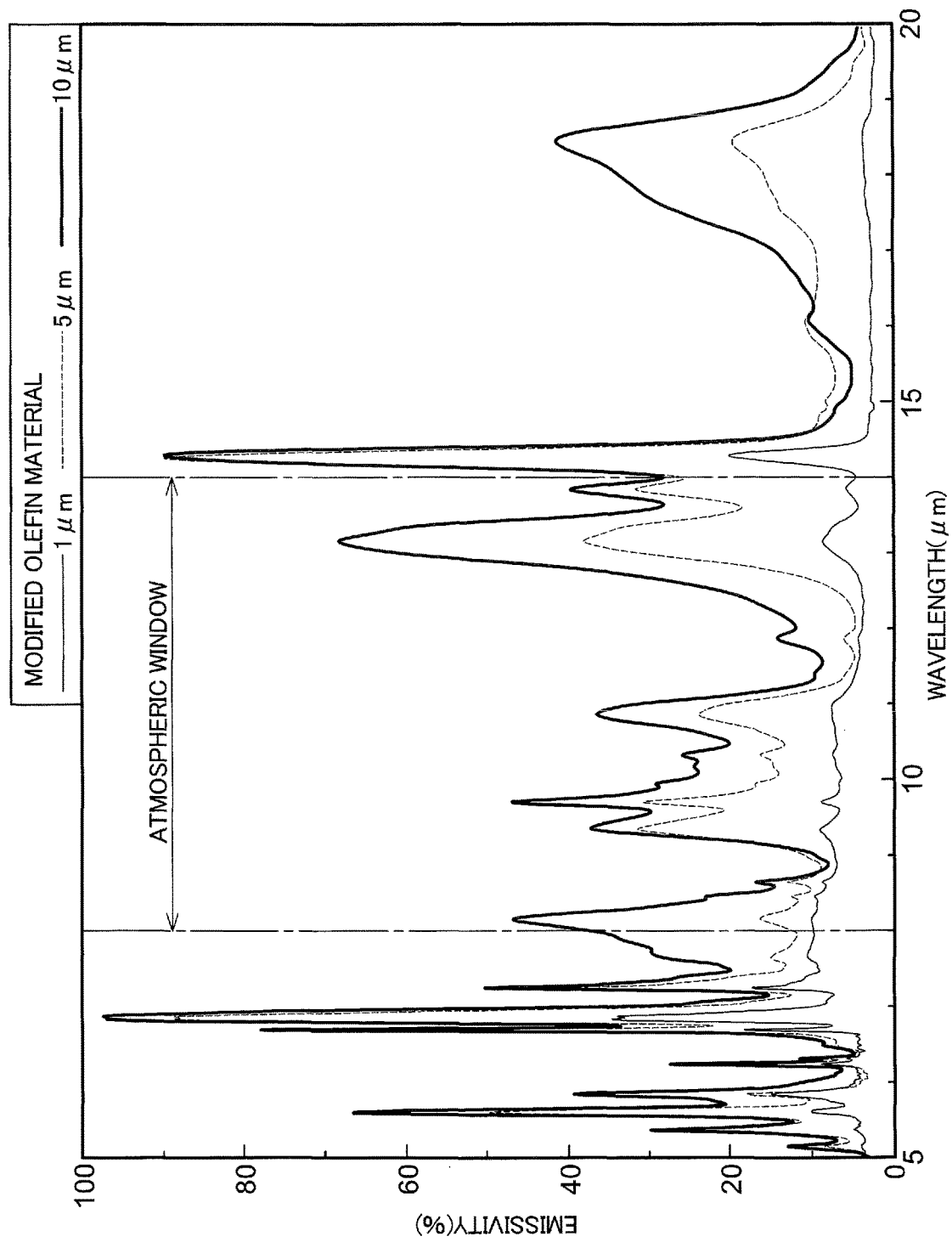
FIG. 8 is a diagram showing an emissivity spectrum of a modified olefin material.

FIG. 8 shows an emissivity spectrum of a modified olefin material that contains an olefin as a main component and does not contain a carbon-fluorine bond (C—F), a carbon-chlorine bond (C—Cl), an ester bond (R—COO—R), an ether bond (C—O—C bond), and a benzene ring. The sample was produced by applying an olefin resin to vapor-deposited silver using a bar coater and drying the olefin resin.

As shown in FIG. 8, the emissivity in the atmospheric window range is small, and under the influence of this, a wavelength average emissivity when the thickness is 10 µm is 27% in the wavelength range from 8 µm to 14 µm and does not fall within the prescribed range of the wavelength average emissivity of 40% or more.

The emissivity shown in FIG. 8 is the emissivity of the olefin resin that was modified to be applied using the bar coater, and in the case of a pure olefin resin, the emissivity in the atmospheric window range is even smaller.

As described above, radiative cooling cannot be performed if the resin material does not contain any of a carbon-fluorine bond (C—F), a carbon-chlorine bond (C—Cl), an ester bond (R—COO—R), an ether bond (C—O—C bond), and a benzene ring.

[Surface Temperatures of Light Reflective Layer and Resin Material Layer]

Heat radiation in the atmospheric window from the resin material layer J occurs in the vicinity of the surface of the resin material.

According to FIG. 4, in the case of silicone rubber, the amount of heat radiation in the atmospheric window range does not increase when the film thickness is larger than 10 µm. That is, in the case of silicone rubber, heat radiation in the atmospheric window mostly occurs in a portion of the resin material that is within a depth of about 10 µm from the surface, and radiation from a deeper portion does not go to the outside.

According to FIG. 5, in the case of a fluorocarbon resin, the amount of heat radiation in the atmospheric window range hardly increases even when the film thickness is increased to more than 100 µm. That is, in the case of a fluorocarbon resin, heat radiation in the atmospheric window occurs in a portion of the resin material that is within a depth of about 100 µm from the surface, and radiation from a deeper portion does not go to the outside.

According to FIG. 6, in the case of a vinyl chloride resin, the amount of heat radiation in the atmospheric window range hardly increases even when the film thickness is increased to more than 100 µm. That is, in the case of a vinyl chloride resin, heat radiation in the atmospheric window occurs in a portion of the resin material that is within a depth of about 100 µm from the surface, and radiation from a deeper portion does not go to the outside.

FIG. 14 shows that the matter described for the vinyl chloride resin also applies to a vinylidene chloride resin.

According to FIG. 7, in the case of an ethylene terephthalate resin, the amount of heat radiation in the atmospheric window range hardly increases even when the film thickness is increased to more than 125 µm. That is, in the case of an ethylene terephthalate resin, heat radiation in the atmospheric window occurs in a portion of the resin material that is within a depth of about 100 µm from the surface, and radiation from a deeper portion does not go to the outside.

As described above, heat radiation from the surface of the resin material in the atmospheric window range occurs in a portion of the resin material that is within a depth of about 100 µm from the surface, and when the thickness of the resin material is increased to more than 100 µm, cold heat obtained through radiative cooling performed by the radiative cooling device CP is insulated by a portion of the resin material that does not contribute to heat radiation.

Assume a case where an ideal resin material layer J that does not absorb sunlight at all is formed on the light reflective layer B. In this case, sunlight is only absorbed by the light reflective layer B of the radiative cooling device CP.

Resin materials generally have a thermal conductivity of about 0.2 W/m/K, and when a calculation is performed taking the thermal conductivity into account, the temperature of a cooling surface (a surface of the light reflective layer B on the side opposite to the resin material layer J) increases when the thickness of the resin material layer J is larger than 20 mm.

Figure 9:
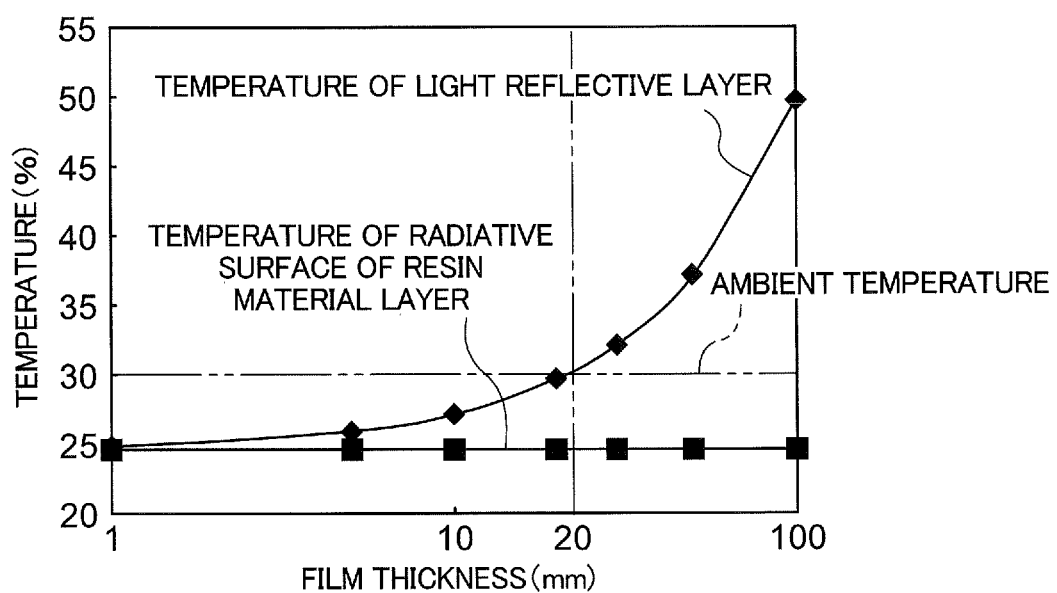
FIG. 9 is a diagram showing a relationship between a temperature of a radiative surface and a temperature of a light reflective layer.

Even if there is an ideal resin material that does not absorb sunlight at all, the thermal conductivity of a resin material is generally about 0.2 W/m/K, and accordingly, as shown in FIG. 9, when the thickness of the resin material layer is larger than 20 mm, the light reflective layer B is heated by solar radiation and the cooling target E disposed on the light reflective layer side is heated. That is, the thickness of the resin material in the radiative cooling device CP needs to be 20 mm or less.

Note that FIG. 9 shows a plot of a surface temperature of the radiative surface H and the temperature of the light reflective layer B in the radiative cooling device (radiative cooling film) CP, which were calculated assuming the time of meridian transit on a sunny day in midsummer in western Japan. The calculation was performed assuming AM1.5 sunlight with an energy density of 1000 W/m$^2$. The ambient temperature is 30° C., and radiation energy is 100 W at 30° C., although this varies according to the temperature. The calculation was performed assuming that the resin material layer did not absorb sunlight. The calculation was performed assuming that the radiative cooling device was used in a windless state and the convective heat transfer coefficient was 5 W/m$^2$/K.

[Absorptivity of Silicone Rubber and the Like]

FIG. 10 shows an absorptivity spectrum of silicone rubber that contains $CH_3$ as a side chain and has a thickness of 100 µm relative to the sunlight spectrum and an absorptivity spectrum of a perfluoroalkoxy fluorocarbon resin with a thickness of 100 µm relative to the sunlight spectrum. It can be found that both of these resins have almost no absorptivity in the ultraviolet range as described above.

As for silicone rubber, the absorptivity increases in the near-infrared range at wavelengths longer than 2.35 µm. However, the intensity of the sunlight spectrum in this wavelength range is low, and therefore, even if the absorptivity at wavelengths longer than 2.35 µm is 100%, the absorbed solar energy is 20 W/m$^2$.

The perfluoroalkoxy fluorocarbon resin has almost no absorptivity in a wavelength range from 0.3 µm to 2.5 µm and absorbs light having wavelengths longer than 2.5 µm. However, even if the film thickness of this resin is increased and the absorptivity at wavelengths longer than 2.5 µm becomes 100%, the absorbed solar energy is about 7 W.

Note that the emissivity in the atmospheric window range becomes approximately 1 when the thickness (film thickness) of the resin material layer J is increased. That is, when the thickness of the resin material layer is large, the amount of heat radiated to the universe in the atmospheric window range when the radiative cooling device is used in a lowland is about 160 W/m$^2$ to 125 W/m$^2$ at 30° C. The amount of light absorbed by the light reflective layer B is about 50 W/m$^2$ as described above, and a sum of the amount of light absorbed by the light reflective layer B and the amount of sunlight absorbed by a thick film of silicone rubber or the perfluoroalkoxy fluorocarbon resin is smaller than the amount of heat radiated to the universe.

Therefore, the maximum film thickness of silicone rubber and the perfluoroalkoxy fluorocarbon resin is 20 mm from the viewpoint of thermal conductivity.

[Light Absorption by Hydrocarbon Resin]

In a case where the resin material forming the resin material layer J is a resin that contains, as a main chain, a hydrocarbon having one or two or more of a carbon-chlorine bond, a carbon-oxygen bond, an ester bond, an ether bond, and a benzene ring or the resin material is a silicone resin that contains a hydrocarbon having 2 or more carbon atoms as a side chain, absorption through vibration, such as bending or stretching of bonds, is observed in the near-infrared range, in addition to ultraviolet ray absorption by electrons contributing to covalent bonds described above.

Specifically, absorption based on fundamental tones of transitions of $CH_3$, $CH_2$, and CH to the first excited state appears in a wavelength range from 1.6 μm to 1.7 μm, a wavelength range from 1.65 μm to 1.75 μm, and at a wavelength of 1.7 μm, respectively. Furthermore, absorption based on fundamental tones of combination tones of $CH_3$, $CH_2$, and CH appears at a wavelength of 1.35 μm, a wavelength of 1.38 μm, and a wavelength of 1.43 μm, respectively. Furthermore, overtones of transitions of $CH_2$ and CH to the second excited state appear around a wavelength of 1.24 μm. Fundamental tones of bending and stretching of a C—H bond are widely distributed in a wavelength range from 2 μm to 2.5 μm.

Also, in a case where the resin material has an ester bond (R—COO—R) or an ether bond (C—O—C), large light absorption appears around a wavelength of 1.9 μm.

According to the absorptivity relational expression described above, absorptivities for these vibrations and bonds are small and inconspicuous when the film thickness of the resin material is small, but become large when the film thickness is large.

Figure 11:
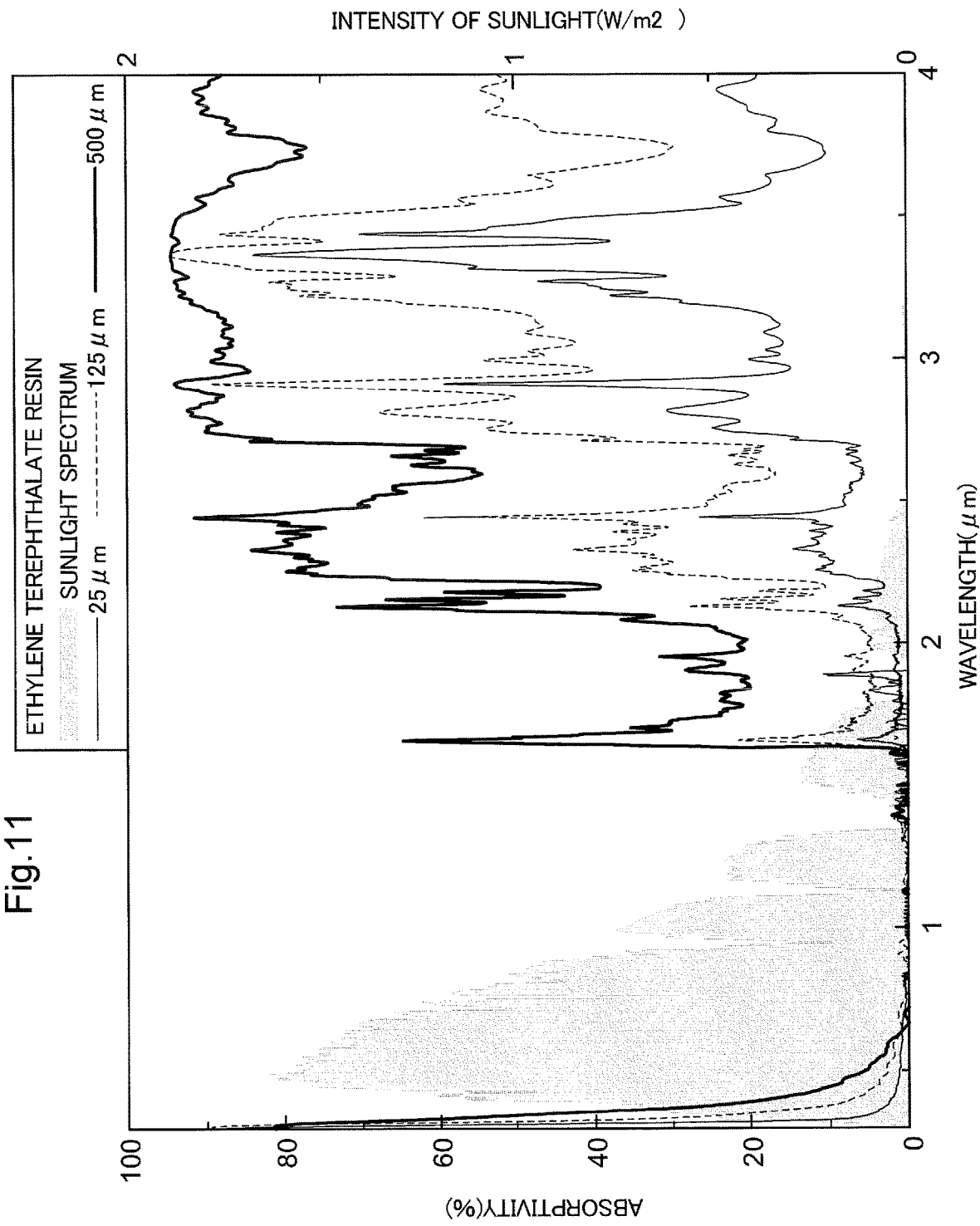
FIG. 11 is a diagram showing an absorptivity spectrum of an ethylene terephthalate resin.

FIG. 11 shows a relationship between the absorptivity of an ethylene terephthalate resin having an ester bond and a benzene ring and the sunlight spectrum in a case where the film thickness is changed.

As shown in FIG. 11, at wavelengths longer than 1.5 μm, light absorption through each vibration increases as the film thickness is increased from 25 μm to 125 μm and 500 μm.

Light absorption increases not only on the long wavelength side but also in the ultraviolet range and the visible range. This is because a light absorption edge for a chemical bond has some width.

When the film thickness is small, the absorptivity becomes large at a wavelength at which the resin has the maximum absorption coefficient, but when the film thickness is increased, a small absorption coefficient for an absorption edge having a width appears as an absorptivity according to the absorptivity relational expression described above. Therefore, when the film thickness is increased, light absorption in the ultraviolet range and the visible range increases.

When the thickness is 25 μm, absorption of the sunlight spectrum is 15 W/m². When the thickness is 125 μm, absorption of the sunlight spectrum is 41 W/m². When the thickness is 500 μm, absorption of the sunlight spectrum is 88 W/m².

The amount of light absorbed by the light reflective layer B is 50 W/m² according to the prescriptions described above, and therefore, when the film thickness is 500 μm, the sum of sunlight absorbed by the ethylene terephthalate resin and sunlight absorbed by the light reflective layer B is 138 W/m². As described above, the maximum value of infrared radiation in the wavelength band of the atmospheric window in summer at a lowland in Japan is about 160 W at 30° C. when the atmosphere is in good conditions, and is usually about 125 W.

Therefore, the radiative cooling properties are not exhibited when the film thickness of the ethylene terephthalate resin is 500 μm or more.

The origin of the absorption spectrum in the wavelength range from 1.5 μm to 4 μm is vibration of a hydrocarbon in the main chain, rather than a functional group, and a hydrocarbon resin shows behavior similar to that of the ethylene terephthalate resin. Also, a hydrocarbon resin shows light absorption by chemical bonds in the ultraviolet range, and shows behavior similar to that of the ethylene terephthalate resin in the ultraviolet range and the visible range as well.

That is, a hydrocarbon resin shows behavior similar to that of the ethylene terephthalate resin in a wavelength range from 0.3 μm to 4 μm. Therefore, the film thickness of a hydrocarbon resin needs to be smaller than 500 μm.

[Light Absorption by Blend Resin]

In a case where the resin material is obtained by blending a resin that contains a carbon-fluorine bond or a siloxane bond as a main chain and a resin that contains a hydrocarbon as a main chain, light absorption by CH, $CH_2$, $CH_3$, or the like appears in the near-infrared range according to the proportion of the blended resin containing a hydrocarbon as a main chain.

When the carbon-fluorine bond or the siloxane bond is the main component, light absorption by the hydrocarbon in the near-infrared range is small, and therefore, the film thickness can be increased up to 20 mm, which is the upper limit set from the viewpoint of thermal conductivity. However, when the blended hydrocarbon resin is the main component, the film thickness needs to be set to 500 μm or less.

Note that a blend of a hydrocarbon and a fluorocarbon resin or silicone rubber encompasses a product obtained by substituting a side chain of the fluorocarbon resin or silicone rubber with the hydrocarbon, and an alternating copolymer, a random copolymer, a block copolymer, and a graft copolymer of a hydrocarbon monomer and a fluorine monomer or a silicone monomer. Examples of alternating copolymers of a fluorine monomer and a hydrocarbon monomer include fluoroethylene-vinyl ester (FEVE), a fluoroolefin-acrylic ester copolymer, an ethylene-tetrafluoroethylene copolymer (ETFE), and an ethylene-chlorotrifluoroethylene copolymer (ECTFE).

Light absorption by CH, $CH_2$, $CH_3$, or the like in the near-infrared range appears according to the molecular weight and proportion of the hydrocarbon side chain, which serves as a substituent. When the monomer introduced as a side chain or a copolymerization monomer has a low molecular weight or the density of the introduced monomer is low, light absorption by the hydrocarbon in the near-infrared range is small, and therefore, the film thickness can be increased to the upper limit of 20 mm set from the viewpoint of thermal conductivity.

When a high-molecular weight hydrocarbon is introduced as a side chain or a copolymerization monomer into a fluorocarbon resin or silicone rubber, the thickness of the resin needs to be set to 500 μm or less.

[Thickness of Resin Material Layer]

From the viewpoint of practical use of the radiative cooling device CP, the thinner the resin material layer J, the better. The thermal conductivity of a resin material is generally lower than those of metal, glass, and the like. In order to effectively cool the cooling target E, it is preferable that the resin material layer J has the minimum required thickness. Heat radiation in the atmospheric window increases as the film thickness of the resin material layer J is increased, and heat radiation energy in the atmospheric window is saturated when the film thickness exceeds a certain thickness.

Although the film thickness at which heat radiation energy is saturated varies according to the resin material, in the case of a fluorocarbon resin, heat radiation energy is generally sufficiently saturated when the film thickness is 300 μm. Therefore, from the viewpoint of thermal conductivity, it is desirable to set the film thickness to be no greater than 300 μm, rather than 500 μm. Furthermore, even when the thickness is about 100 μm, sufficient heat radiation can be obtained in the atmospheric window range although heat radiation is not saturated. The smaller the thickness is, the higher the thermal transmittance becomes and the more effectively the temperature of the cooling target can be reduced, and therefore, in the case of a fluorocarbon resin, the thickness is preferably set to about 100 μm or less.

Absorption coefficients of a carbon-silicon bond, a carbon-chlorine bond, a carbon-oxygen bond, an ester bond, and an ether bond are larger than an absorption coefficient of a C—F bond. Naturally, it is desirable to set the film thickness to be no greater than 300 μm, rather than 500 μm, from the viewpoint of thermal conductivity, but if the film thickness is further reduced to increase the thermal conductivity, an even greater radiative cooling effect can be expected.

In the case of a resin that contains any of a carbon-chlorine bond, a carbon-oxygen bond, an ester bond, an ether bond, and a benzene ring, heat radiation energy is saturated even when the thickness is 100 μm, and sufficient heat radiation can be obtained in the atmospheric window range even when the thickness is 50 μm. The smaller the thickness of the resin material is, the higher the thermal transmittance becomes and the more effectively the temperature of the cooling target can be reduced, and therefore, in the case of a resin containing any of a carbon-chlorine bond, a carbon-oxygen bond, an ester bond, an ether bond, and a benzene ring, it is possible to suppress thermal insulation properties and effectively cool the cooling target E by setting the thickness to 50 μm or less. In the case of a resin containing a carbon-chlorine bond, it is possible to effectively cool the cooling target E when the thickness is 100 μm or less.

When the thickness is reduced, it is possible to obtain an effect other than the effect of suppressing thermal insulation properties and facilitating conduction of cold heat. That is, it is possible to suppress light absorption by CH, $CH_2$, and $CH_3$ in the near-infrared range, which occurs in the case of a resin that contains any of a carbon-chlorine bond, a carbon-oxygen bond, an ester bond, and an ether bond. When the thickness is reduced, absorption of sunlight by these can be suppressed and consequently, cooling capability of the radiative cooling device CP is increased.

From the viewpoint described above, in the case of a resin containing any of a carbon-chlorine bond, a carbon-oxygen bond, an ester bond, an ether bond, and a benzene ring, the radiative cooling effect can be more effectively exhibited under solar radiation when the thickness is 50 μm or less.

In the case of a carbon-silicon bond, heat radiation in the atmospheric window is sufficiently saturated even when the thickness is 50 μm, and sufficient heat radiation can be obtained in the atmospheric window even when the thickness is 10 μm. The smaller the thickness of the resin material layer J is, the higher the thermal transmittance becomes and the more effectively the temperature of the cooling target E can be reduced, and therefore, in the case of a resin containing a carbon-silicon bond, it is possible to suppress thermal insulation properties and effectively cool the cooling target E by setting the thickness to 10 μm or less. When the thickness is reduced, absorption of sunlight can be suppressed and consequently, cooling capability of the radiative cooling device CP is increased.

From the viewpoint described above, in the case of a resin containing a carbon-silicon bond, the radiative cooling effect can be more effectively exhibited under solar radiation when the thickness is 10 μm or less.

[Details of Light Reflective Layer]

In order to make the light reflective layer B have the reflectance characteristics described above, silver or a silver alloy needs to be used as a reflective material disposed on the radiative surface H side (the resin material layer J side).

Figure 12:
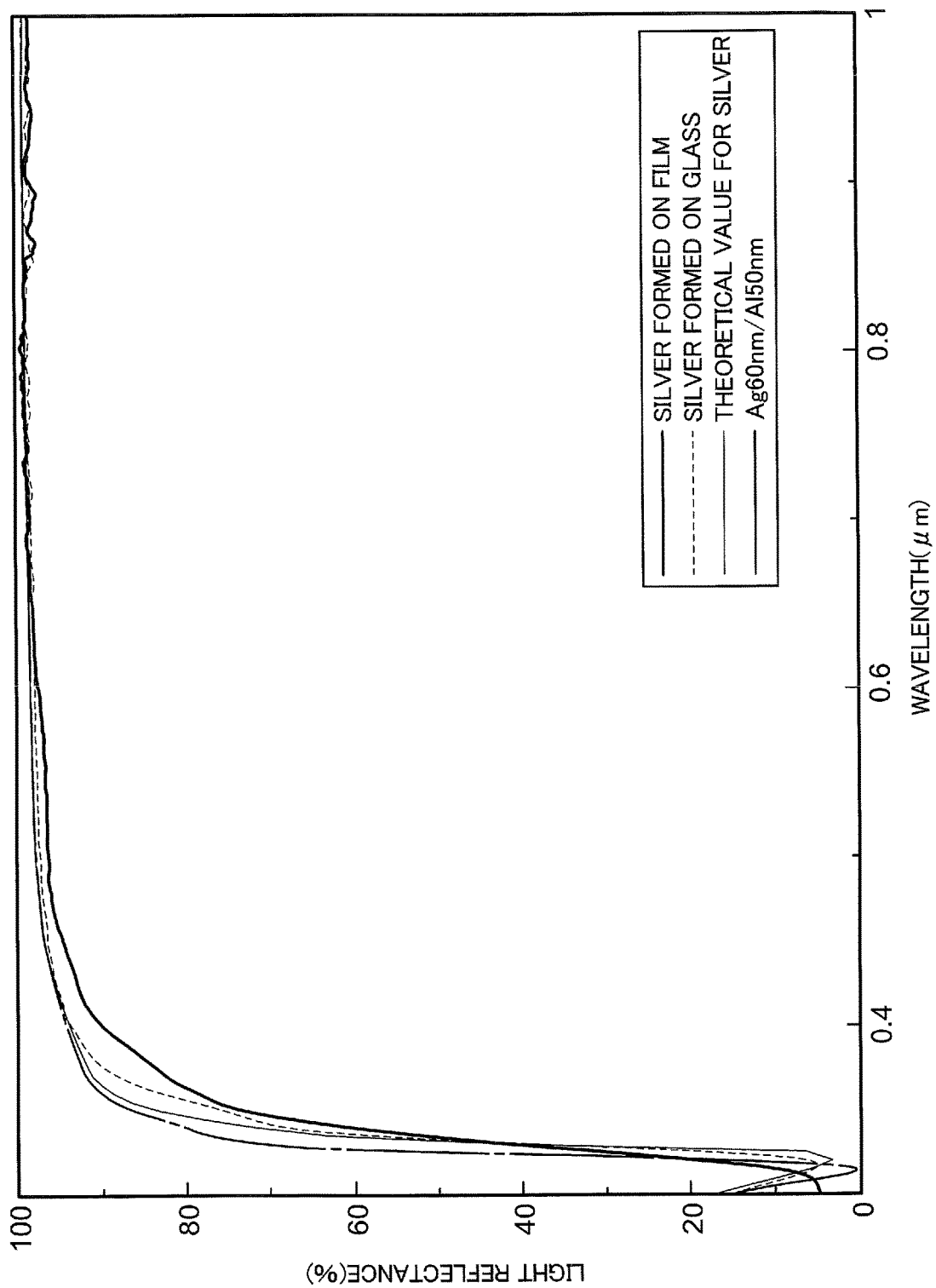
FIG. 12 is a diagram showing a reflectance spectrum of a light reflective layer that contains silver as a base material.

As shown in FIG. 12, when silver is used as a base material of the light reflective layer B, the light reflective layer B can have the required reflectance.

In a case where sunlight is to be reflected only by silver or a silver alloy so as to satisfy the reflectance characteristics described above, a thickness of 50 nm or more is required.

However, in order to make the light reflective layer B flexible, the thickness needs to be 100 μm or less. If the thickness is larger than 100 μm, the light reflective layer becomes difficult to bend.

It is possible to use, as a silver alloy, an alloy obtained by adding any of copper, palladium, gold, zinc, tin, magnesium, nickel, and titanium in an amount of, for example, about 0.4 mass % to 4.5 mass % to silver. As a specific example, it is possible to use "APC-TR (manufactured by Furuya Metal Co., Ltd.)", which is a silver alloy manufactured by adding copper and palladium to silver.

In order to make the light reflective layer B have the reflectance characteristics described above, it is also possible to adopt a structure obtained by stacking silver or a silver alloy disposed adjacent to the protective layer D and aluminum or an aluminum alloy disposed apart from the protective layer D. In this case as well, it is necessary to use silver or a silver alloy as the reflective material disposed on the radiative surface H side (the resin material layer J side).

In the case where the light reflective layer is constituted by two layers made of silver (silver alloy) and aluminum (aluminum alloy), the thickness of the silver layer needs to be 10 nm or more and the thickness of the aluminum layer needs to be 30 nm or more.

However, in order to make the light reflective layer B flexible, the sum of the thickness of the silver layer and the thickness of the aluminum layer needs to be 100 μm or less. If the sum is larger than 100 μm, the light reflective layer becomes difficult to bend.

It is possible to use, as an aluminum alloy, an alloy obtained by adding any of copper, manganese, silicon, magnesium, zinc, carbon steel for mechanical structures, yttrium, lanthanum, gadolinium, and terbium to aluminum.

Silver and a silver alloy are weak to rain and moisture and need to be protected from them. Also, discoloration of silver and a silver alloy needs to be suppressed. Therefore, the protective layer D that protects silver needs to be provided adjacent to silver or a silver alloy as shown in FIGS. 16 to 19.

Details of the protective layer D will be described later.

[Experimental Results]

Silver layers with a thickness of 300 nm were formed on glass substrates, and silicone rubber having a siloxane bond, fluoroethylene vinyl ether having a carbon-fluorine bond, a modified olefin (modified olefin material), and a vinyl chloride resin were applied to the silver layers using a bar coater while controlling the film thickness, and radiative cooling performance was measured.

The radiative cooling performance was evaluated outdoors at an ambient temperature of 35° C. when 3 hours elapsed from the time of meridian transit in late June by measuring the temperature (° C.) of rear surfaces of the substrates while keeping the substrates in a highly thermally insulated state. As for the vinyl chloride resin, the evaluation was performed at an ambient temperature of 29° C. Whether or not the radiative cooling effect was exhibited was evaluated based on whether the temperature was lower or higher than the ambient temperature when 5 minutes elapsed after the substrates were set on a jig.

FIG. 15 shows results of the radiative cooling test.

Figure 13:
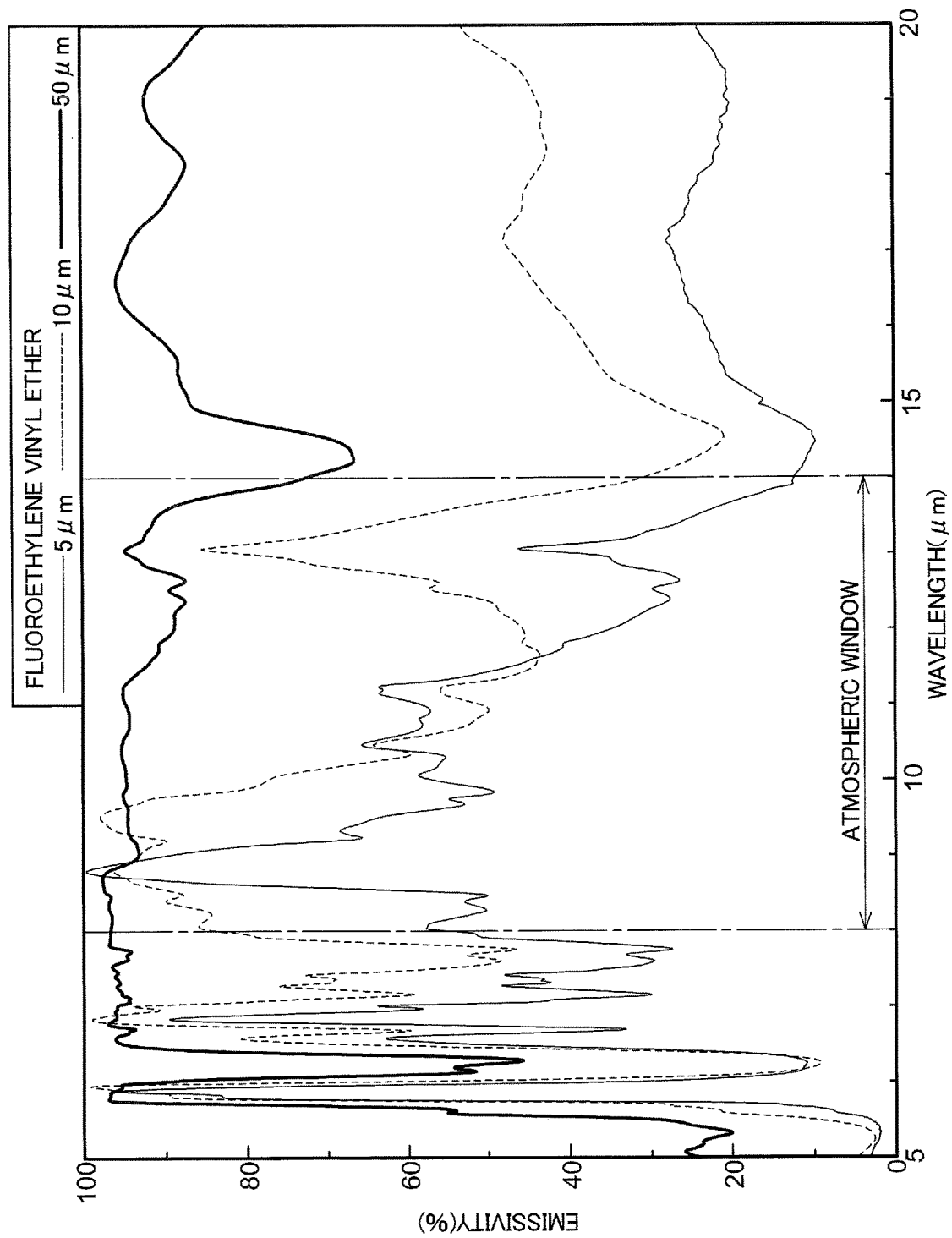
FIG. 13 is a diagram showing an emissivity spectrum of fluoroethylene vinyl ether.

Note that the emissivity of fluoroethylene vinyl ether in the atmospheric window range is as shown in FIG. 13. The emissivity of silicone rubber is as shown in FIG. 4, the emissivity of the modified olefin (modified olefin material) is as shown in FIG. 8, and the emissivity of the vinyl chloride resin is as shown in FIG. 6.

It was found that silicone rubber having a siloxane bond exhibited radiative cooling capability with a thickness of 1 µm or more as theoretically expected.

It was found that fluoroethylene vinyl ether having a carbon-fluorine bond exhibited radiative cooling capability with a thickness of 5 µm, which is thinner than the theoretically expected film thickness of 10 µm. This is because not only light absorption by the carbon-fluorine bond in the atmospheric window, light absorption by an ether bond in vinyl ether was added, and the absorptivity in the atmospheric window increased when compared with cases where either the carbon-fluorine bond or the ether bond was contained alone.

The modified olefin (modified olefin material) hardly radiates heat in the atmospheric window range, and accordingly does not have radiative cooling capability.

[Specific Configuration of Radiative Cooling Device]

As shown in FIGS. 16 to 19, the radiative cooling device CP according to the present invention can be made so as to have a film structure. Resin materials forming the resin material layer J and the protective layer D are flexible, and accordingly, when the light reflective layer B is formed as a thin film, the light reflective layer B can be made flexible as well, and consequently the radiative cooling device CP can be made as a flexible film (radiative cooling film).

The film-shaped radiative cooling device CP (radiative cooling film) can be wrapped around an outer circumferential surface of an automobile, an external wall of a warehouse or a building, or an outer circumferential surface of a helmet using an adhesive, for example. Thus, it is possible to easily make the radiative cooling device CP exhibit its radiative cooling capability through post attachment of the radiative cooling device CP to an existing object.

The film-shaped radiative cooling device CP (radiative cooling film) can be attached to various objects that need to be cooled, such as outer surfaces of various tents, an outer surface of a box for housing electrical equipment or the like, an outer surface of a container used for goods transportation, an outer surface of a milk tank for storing milk, and an outer surface of a milk storage portion of a milk tank lorry.

Various forms are conceivable to make the radiative cooling device CP in a film shape. For example, it is conceivable to apply the protective layer D and the resin material layer J to the light reflective layer B formed in a film shape. Alternatively, it is conceivable to attach the protective layer D and the resin material layer J to the light reflective layer B formed in a film shape. Alternatively, it is conceivable to apply or attach the protective layer D to the resin material layer J formed in a film shape, and form the light reflective layer B on the protective layer D through vapor deposition, sputtering, ion plating, a silver mirror reaction, or the like.

More specifically, a radiative cooling device CP (radiative cooling film) shown in FIG. 16 is obtained by forming the protective layer D on the upper side of the light reflective layer B, forming the resin material layer J on the protective layer D, and also forming a lower protective layer Ds on the lower side of the light reflective layer B in a case where the light reflective layer B is constituted by a single layer of silver or a silver alloy or two layers respectively made of silver (silver alloy) and aluminum (aluminum alloy).

As a method for producing the radiative cooling device CP (radiative cooling film) shown in FIG. 16, it is possible to use a method of applying the protective layer D, the light reflective layer B, and the lower protective layer Ds in this order on the resin material layer J formed in a film shape to form these layers into a single piece.

A radiative cooling device CP (radiative cooling film) shown in FIG. 17 is obtained by forming the light reflective layer B that is constituted by an aluminum layer B1 formed from aluminum foil serving as aluminum (aluminum alloy) and a silver layer B2 made of silver or a silver alloy, forming the protective layer D on the upper side of the light reflective layer B, and forming the resin material layer J on the protective layer D.

As a method for producing the radiative cooling device CP (radiative cooling film) shown in FIG. 17, it is possible to use a method of applying the silver layer B2, the protective layer D, and the resin material layer J in this order on the aluminum layer B1 formed from aluminum foil, to form these layers into a single piece.

As another method, it is possible to use a method of forming the resin material layer J in a film shape, applying the protective layer D and the silver layer B2 in this order on the film-shaped resin material layer J, and attaching the aluminum layer B1 to the silver layer B2.

Figure 18:
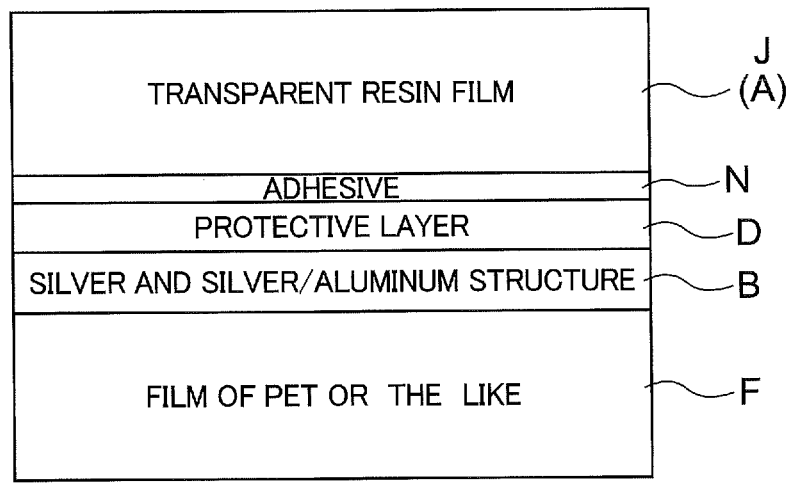
FIG. 18 is a diagram showing a specific configuration of the radiative cooling device.

A radiative cooling device CP (radiative cooling film) shown in FIG. 18 is obtained by forming the protective layer D on the upper side of the light reflective layer B, forming the resin material layer J on the protective layer D, and forming a film layer F made of PET or the like on the lower side of the light reflective layer B in a case where the light reflective layer B is constituted by a single layer made of silver or a silver alloy or two layers respectively made of silver (silver alloy) and aluminum (aluminum alloy).

As a method for producing the radiative cooling device CP (radiative cooling film) shown in FIG. 18, it is possible to use a method of applying the light reflective layer B and the protective layer D in this order on the film layer F (corresponding to a substrate) formed in a film shape using PET (ethylene terephthalate resin) or the like to form these layers into a single piece, and joining (attaching) the resin material layer J, which has been separately formed, to the protective layer D using an adhesive layer N (an example of a joining layer).

Examples of adhesive agents (pressure-sensitive adhesive agents) that can be used for the adhesive layer N include a urethane adhesive agent (pressure-sensitive adhesive agent), an acrylic adhesive agent (pressure-sensitive adhesive agent), and an EVA (ethylene vinyl acetate) adhesive agent (pressure-sensitive adhesive agent), and it is desirable to use an adhesive agent (pressure-sensitive adhesive agent) that is highly transparent with respect to sunlight. The thickness of the adhesive layer N is preferably within a range of 1 µm or more and 100 µm or less, and more preferably within a range of 1 µm or more and 50 µm or less.

Figure 19:
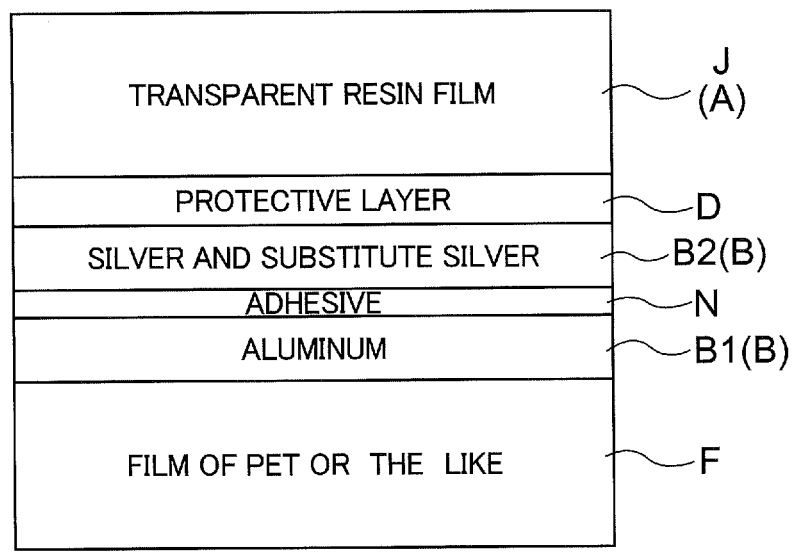
FIG. 19 is a diagram showing a specific configuration of the radiative cooling device.

A radiative cooling device CP (radiative cooling film) shown in FIG. 19 includes the light reflective layer B which is formed of an aluminum layer B1 which serves as aluminum (aluminum alloy) and a silver layer B2 which is made of silver or a silver alloy (substitute silver). The radiative cooling device CP (radiative cooling film) is obtained by forming the aluminum layer B1, on a film layer F (corresponding to a substrate) formed in a film shape using PET (ethylene terephthalate resin) or the like, forming the protective layer D on the upper side of the silver layer B2, and forming the resin material layer J on the upper side of the protective layer D.

As a method for producing the radiative cooling device CP (radiative cooling film) shown in FIG. 19, it is possible to use a method of applying the aluminum layer B1 to the film layer F to form the film layer F and the aluminum layer B1 into a single piece, applying the protective layer D and the silver layer B2 to the film-shaped resin material layer J to form the resin material layer J, the protective layer D, and the silver layer B2 into a single piece, and joining the aluminum layer B1 and the silver layer B2 using an adhesive layer N.

Examples of adhesive agents (pressure-sensitive adhesive agents) that can be used for the adhesive layer N include a urethane adhesive agent (pressure-sensitive adhesive agent), an acrylic adhesive agent (pressure-sensitive adhesive agent), and an EVA (ethylene vinyl acetate) adhesive agent (pressure-sensitive adhesive agent), and it is desirable to use an adhesive agent (pressure-sensitive adhesive agent) that is highly transparent with respect to sunlight. The thickness of the adhesive layer N is preferably within a range of 1 µm or more and 100 µm or less, and more preferably within a range of 1 µm or more and 50 µm or less.

Figure 30:
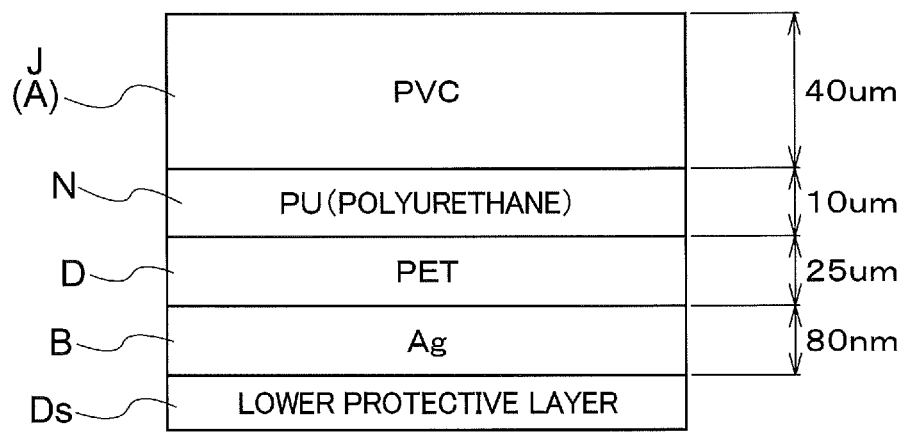
FIG. 30 is a diagram showing an appropriate specific configuration of the radiative cooling device.
Figure 31:
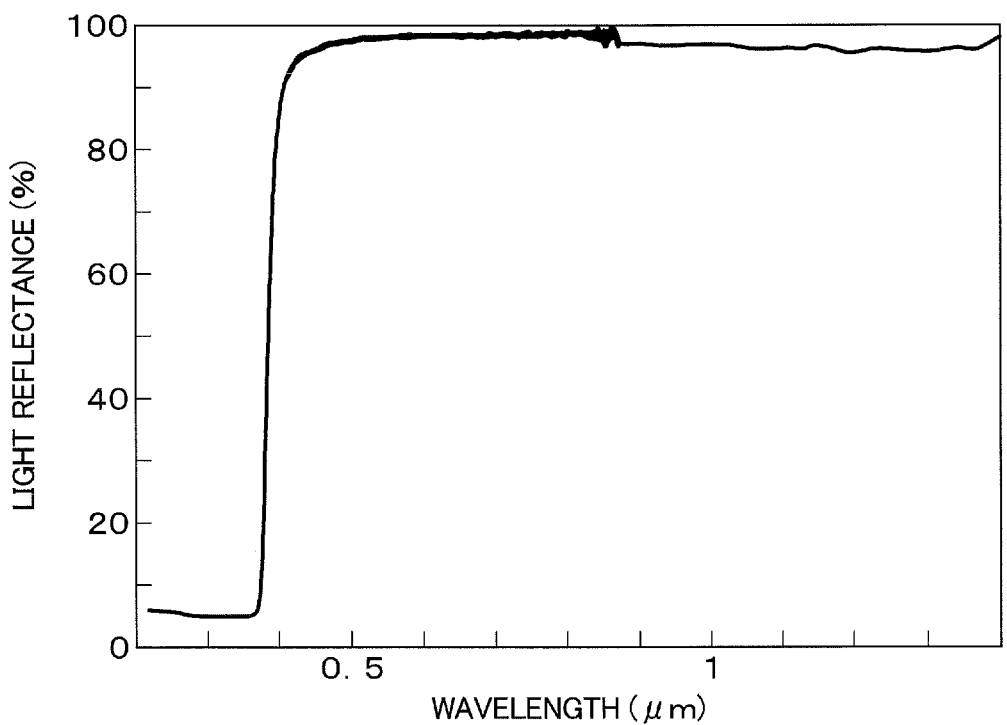
FIG. 31 is a diagram showing a reflectance spectrum of the radiative cooling device having the appropriate specific configuration.
Figure 32:
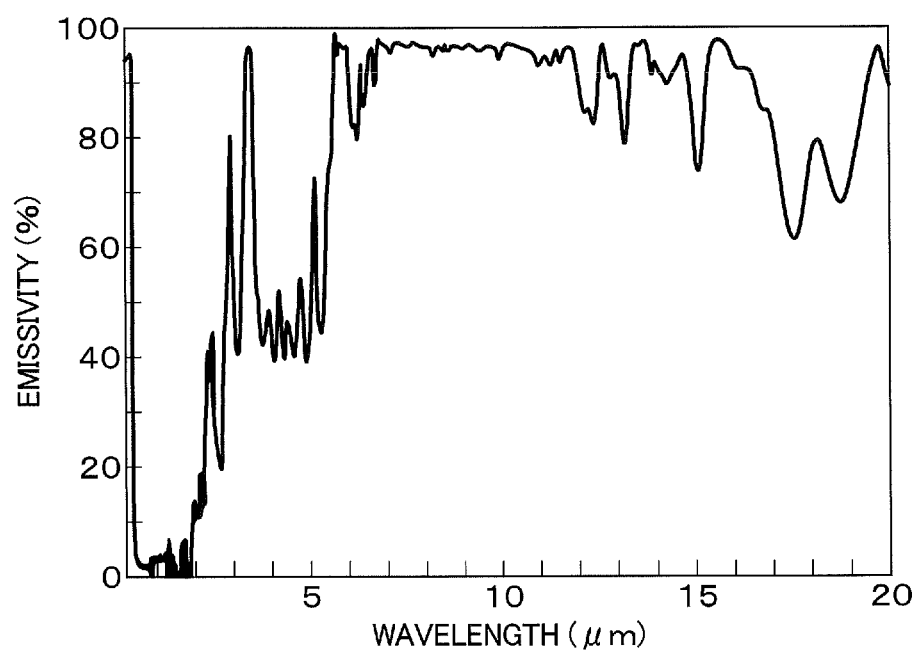
FIG. 32 is a diagram showing an emissivity spectrum of the radiative cooling device having the appropriate specific configuration.

FIG. 30 shows an appropriate specific configuration of the radiative cooling device CP (radiative cooling film), FIG. 31 shows a reflectance spectrum of the radiative cooling device CP (radiative cooling film) having the appropriate specific configuration, and FIG. 32 shows an emissivity spectrum of the radiative cooling device CP.

The radiative cooling device CP (radiative cooling film) shown in FIG. 30 is obtained by forming the light reflective layer B from silver (Ag) with a thickness of 80 nm, forming the protective layer D from polyethylene terephthalate (PET) with a thickness of 25 nm on the upper side of the light reflective layer B, joining (attaching) the resin material layer J formed from vinyl chloride (PVC) with a thickness of 40 µm to the protective layer D using an adhesive layer N formed from a urethane adhesive agent (denoted by PU (polyurethane) in FIG. 30) with a thickness of 10 µm, and also forming a lower protective layer Ds on the lower side of the light reflective layer B.

[Details of Protective Layer]

The protective layer D is formed from a polyolefin based resin with a thickness of 300 nm or more and 40 µm or less or polyethylene terephthalate with a thickness of 17 µm or more and 40 µm or less.

Examples of the polyolefin based resin include polyethylene and polypropylene.

Figure 20:
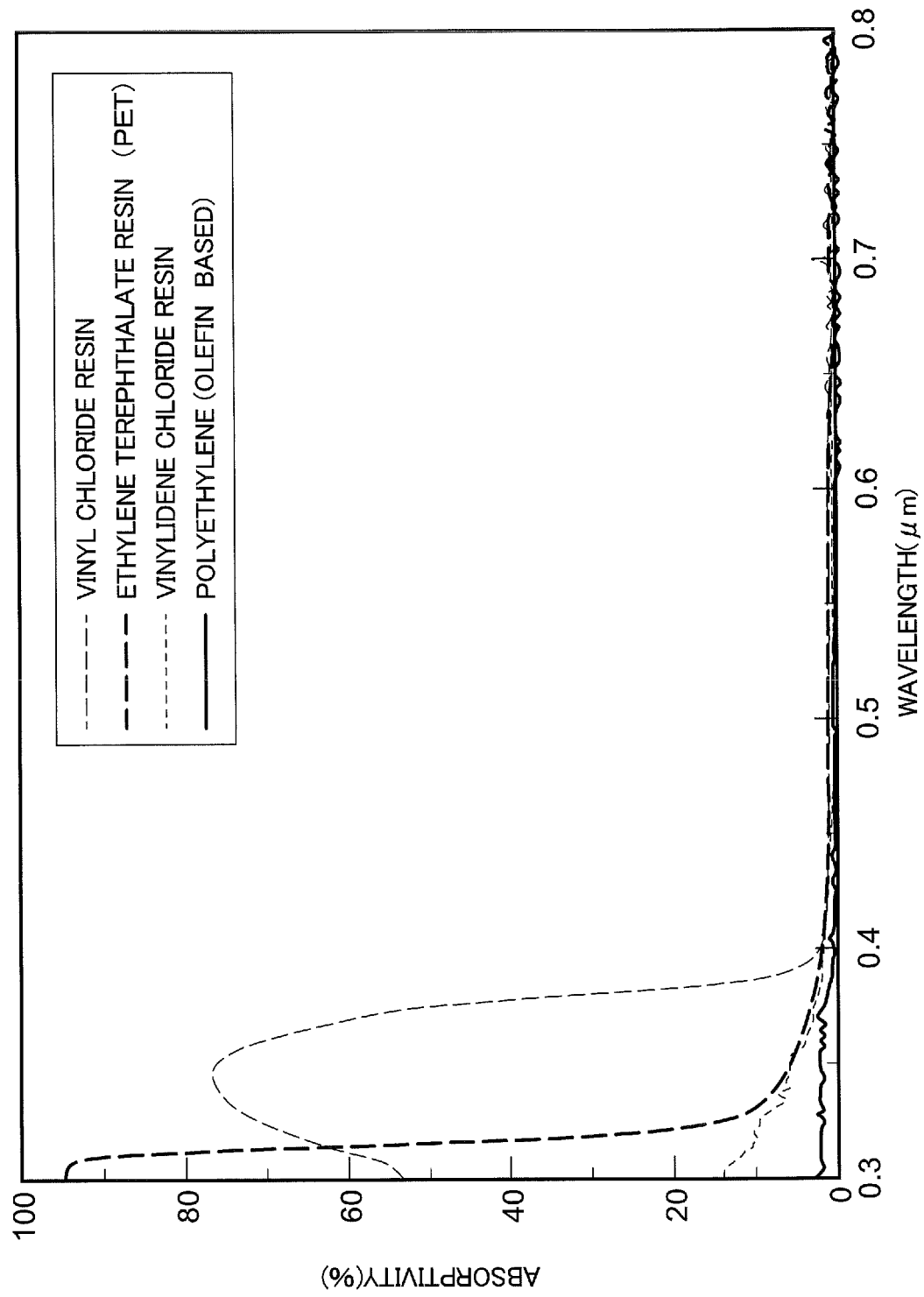
FIG. 20 is a diagram showing a relationship between absorptivities of resin materials and the wavelength.

FIG. 20 shows absorptivities of polyethylene, a vinylidene chloride resin, an ethylene terephthalate resin, and a vinyl chloride resin for ultraviolet rays.

Figure 21:
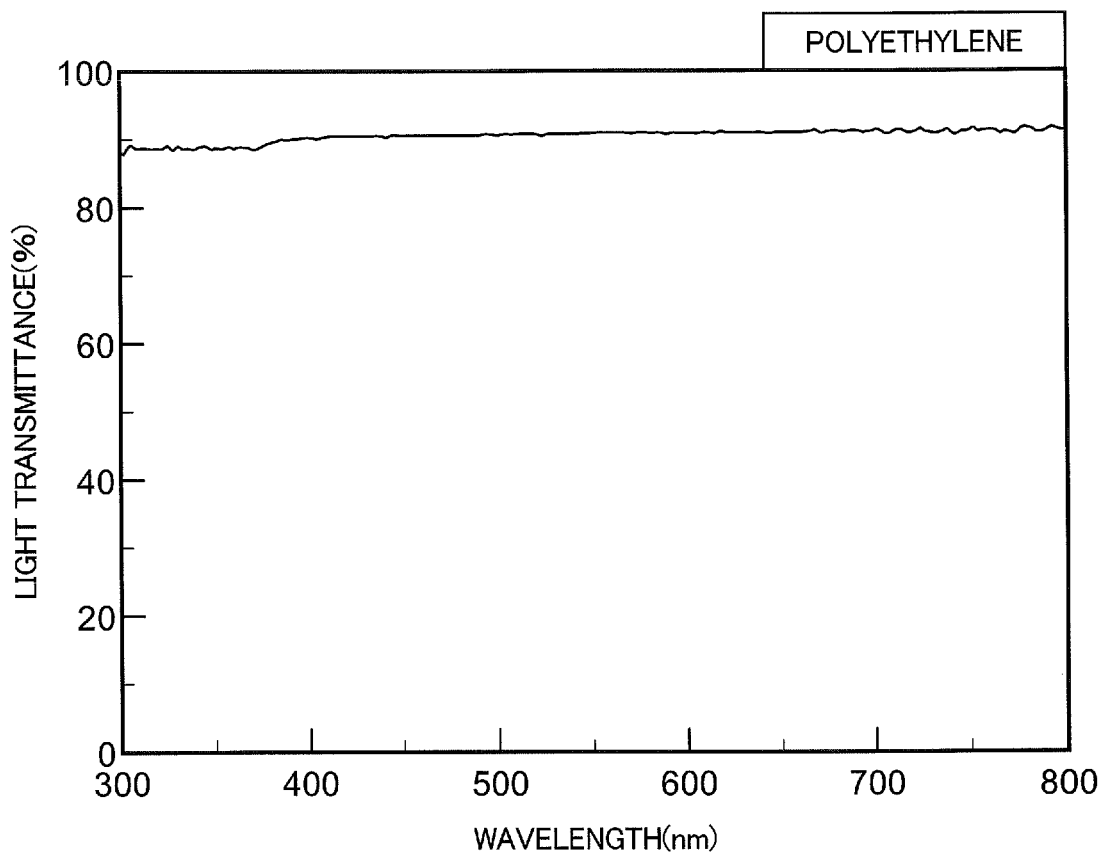
FIG. 21 is a diagram showing a relationship between the light transmittance of polyethylene and the wavelength.

FIG. 21 shows a light transmittance of polyethylene, which is preferably used as a synthetic resin for forming the protective layer D.

The radiative cooling device CP (radiative cooling film) exhibits radiative cooling action not only at night but also under solar radiation. Accordingly, in order to maintain a state in which the light reflective layer B exhibits its light reflecting function, it is necessary to prevent discoloration of silver constituting the light reflective layer B under solar radiation by protecting the light reflective layer B using the protective layer D.

In the case where the protective layer D is formed from a polyolefin based resin with a thickness of 300 nm or more and 40 µm or less, the protective layer D is unlikely to be deteriorated by absorbing ultraviolet rays because the polyolefin based resin is a synthetic resin that has an absorptivity of 10% or less for ultraviolet rays over the entire wavelength range of ultraviolet rays from 0.3 µm to 0.4 µm.

Moreover, since the thickness of the polyolefin based resin forming the protective layer D is 300 nm or more, the protective layer D favorably exhibits a blocking function of blocking radicals generated in the resin material layer J so as not to reach silver or a silver alloy forming the light reflective layer B and blocking moisture that has permeated through the resin material layer J so as not to reach silver or a silver alloy forming the light reflective layer B, and thus it is possible to suppress discoloration of silver or a silver alloy forming the light reflective layer B.

Although the protective layer D formed from the polyolefin based resin is deteriorated while forming radicals by absorbing ultraviolet rays on the side of its surface disposed away from the light reflective layer B, the generated radicals do not reach the light reflective layer because the protective layer D has a thickness of 300 nm or more. Also, although the protective layer D is deteriorated while forming radicals, the progress of deterioration is slow due to absorption of ultraviolet rays is low, and therefore, the protective layer D exhibits the above-described blocking function for a long period of time.

In the case where the protective layer D is formed from an ethylene terephthalate resin with a thickness of 17 µm or more and 40 µm or less, the ethylene terephthalate resin is a synthetic resin that has a higher absorptivity for ultraviolet rays than the polyolefin based resin in the wavelength range of ultraviolet rays from 0.3 µm to 0.4 µm. However, the protective layer has a thickness of 17 µm or more, and therefore, the protective layer D favorably exhibits the blocking function of blocking radicals generated in the resin material layer J so as not to reach silver or a silver alloy forming the light reflective layer B and blocking moisture that has permeated through the resin material layer J so as not to reach silver or a silver alloy forming the light reflective layer B for a long period of time, and thus it is possible to suppress discoloration of silver or a silver alloy forming the light reflective layer B.

That is, the protective layer formed from the ethylene terephthalate resin is deteriorated while forming radicals by absorbing ultraviolet rays on the side of its surface disposed away from the light reflective layer B, but the generated radicals do not reach the light reflective layer because the protective layer D has a thickness of 17 µm or more. Also, although the protective layer D is deteriorated while forming radicals, the protective layer D has a thickness of 17 µm or more, and accordingly, exhibits the above-described blocking function for a long period of time.

When described in more detail, the ethylene terephthalate resin (PET) is deteriorated as a result of ester bonds of ethylene glycol and terephthalic acid being cleaved by ultraviolet rays and radicals being formed. This deterioration progresses sequentially from the surface of the ethylene terephthalate resin (PET) irradiated with ultraviolet rays.

For example, when the ethylene terephthalate resin (PET) is irradiated with ultraviolet rays with an intensity equivalent to that in Osaka, ester bonds of the ethylene terephthalate resin (PET) are cleaved sequentially from the irradiated surface by a depth of about 9 nm per day. The ethylene terephthalate resin (PET) has been sufficiently polymerized, and therefore, a surface portion of the ethylene terephthalate resin (PET) where the cleavage has occurred does not damage silver (silver alloy) forming the light reflective layer B, but when a cleaved end of the ethylene terephthalate resin (PET) reaches the silver (silver alloy) forming the light reflective layer B, the silver (silver alloy) is discolored.

Therefore, in order to make the protective layer D durable for a year or longer when used outdoors, the protective layer needs to have a thickness of about 3 µm, which is calculated by adding up 9 nm/day for 365 days. In order to make the protective layer D formed from the ethylene terephthalate resin (PET) durable for three years or longer, the protective layer needs to have a thickness of 10 µm or more. In order to make the protective layer D durable for five years or longer, the protective layer needs to have a thickness of 17 µm or more.

Note that the upper limit value of the thickness of the protective layer D is set for the cases where the protective layer D is formed from the polyolefin based resin or the ethylene terephthalate resin in order to avoid a situation in which the protective layer D exhibits thermal insulation properties, which do not contribute to radiative cooling. That is, as the thickness of the protective layer D is increased, the protective layer D exhibits thermal insulation properties, which do not contribute to radiative cooling, and therefore, the upper limit value of the thickness is set to prevent the protective layer D from exhibiting thermal insulation properties, which do not contribute to radiative cooling, while allowing the protective layer D to exhibit the function of protecting the light reflective layer B.

In the case where the adhesive layer N is disposed between the resin material layer J and the protective layer D as shown in FIG. 18, radicals are generated from the adhesive layer N as well, but it is possible to keep the radicals generated in the adhesive layer N from reaching the light reflective layer B for a long period of time if the thickness of the polyolefin based resin forming the protective layer D is 300 nm or more or the thickness of the ethylene terephthalate resin forming the protective layer D is 17 µm or more.

Note that, when the thickness of the protective layer D is increased, there is no demerit in preventing coloration of silver (silver alloy) forming the light reflective layer B, but there arises a problem in radiative cooling as described above. That is, thermal insulation properties of a radiative cooling material are enhanced when the thickness is increased.

Figure 25:
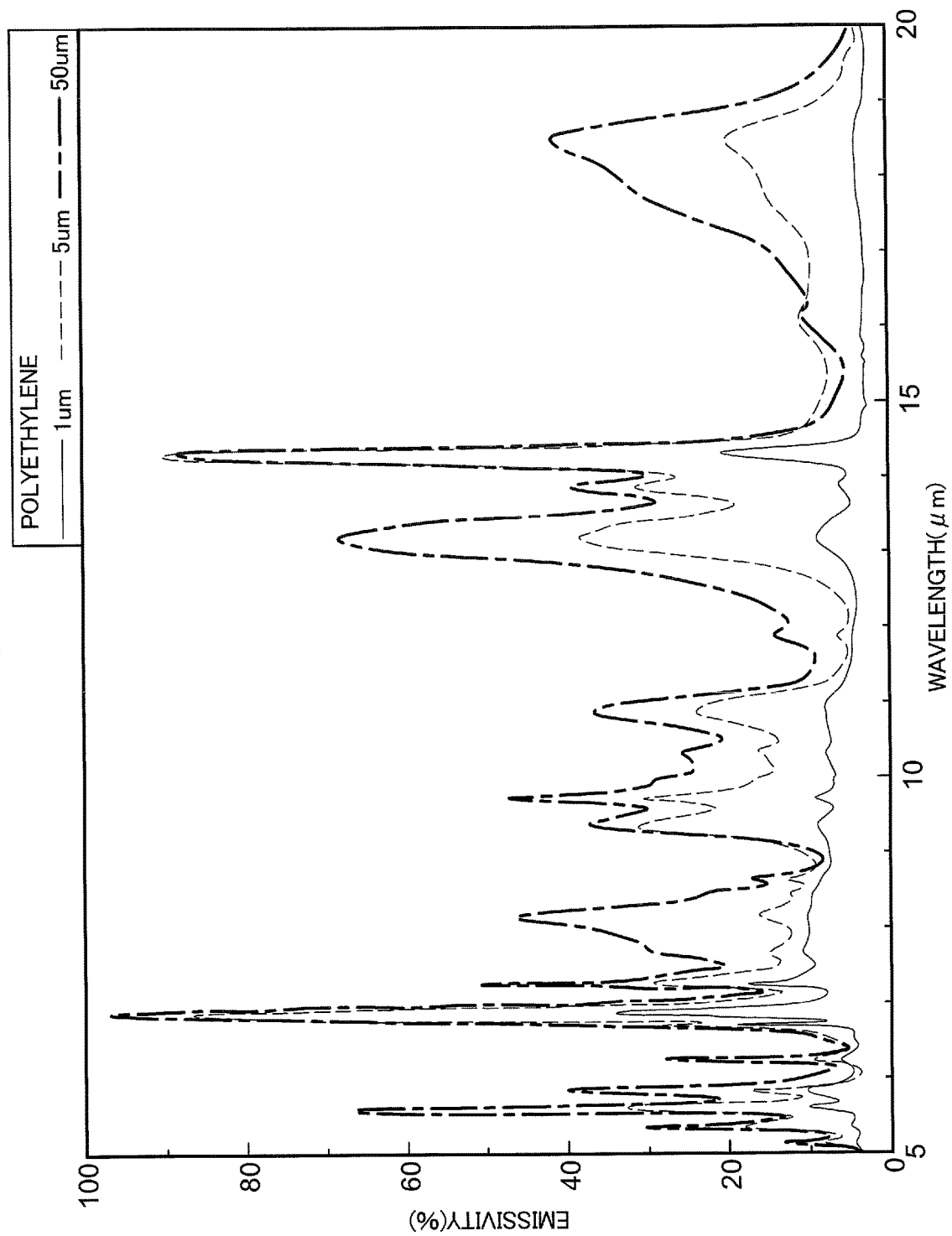
FIG. 25 is a diagram showing an emissivity spectrum of polyethylene.

For example, in the case of a resin that contains polyethylene as a main component and is an excellent synthetic resin for forming the protective layer D, the emissivity in the atmospheric window is small as shown in FIG. 25, and therefore, even if the thickness is increased, the increase does not contribute to radiative cooling. Conversely, thermal insulation properties of the radiative cooling material are enhanced when the thickness is increased. Next, when the thickness is increased, absorption through vibration of the main chain increases in the near-infrared range, and an effect of increasing absorption of sunlight increases.

For these reasons, a protective layer D having a large thickness is disadvantageous in radiative cooling. From the viewpoints described above, the thickness of the protective layer D formed from the polyolefin based resin is preferably 5 µm or less, and more preferably 1 µm or less.

[Consideration on Protective Layer]

Figure 22:
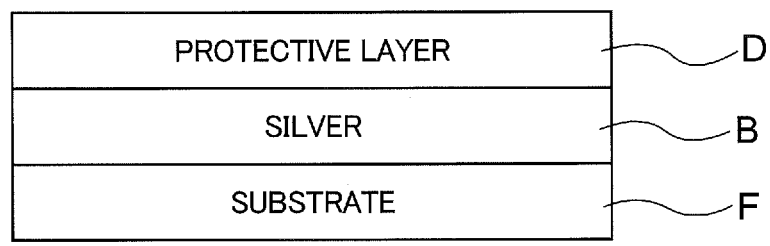
FIG. 22 is a diagram showing a configuration for a test.

In order to examine a difference in coloration of silver according to the protective layer D, samples that did not include the resin material layer J as the infrared radiative layer A and in which the protective layer D was exposed were produced as shown in FIG. 22 and coloration of silver after the samples were irradiated with simulated sunlight was examined.

That is, two types of resins, one of which being a common acrylic resin that absorbs ultraviolet rays (e.g., a methyl methacrylate resin in which a benzotriazole ultraviolet absorbing agent is mixed) and the other being polyethylene, were each applied as the protective layer D to a film layer F (corresponding to a substrate) provided with silver that served as the light reflective layer B, using a bar coater to form the samples, and functions of the resins as the protective layer D were examined. Thicknesses of the applied protective layers D were 10 µm and 1 µm, respectively.

Note that the film layer F (corresponding to a substrate) was formed in a film shape using PET (ethylene terephthalate resin) or the like.

Figure 24:
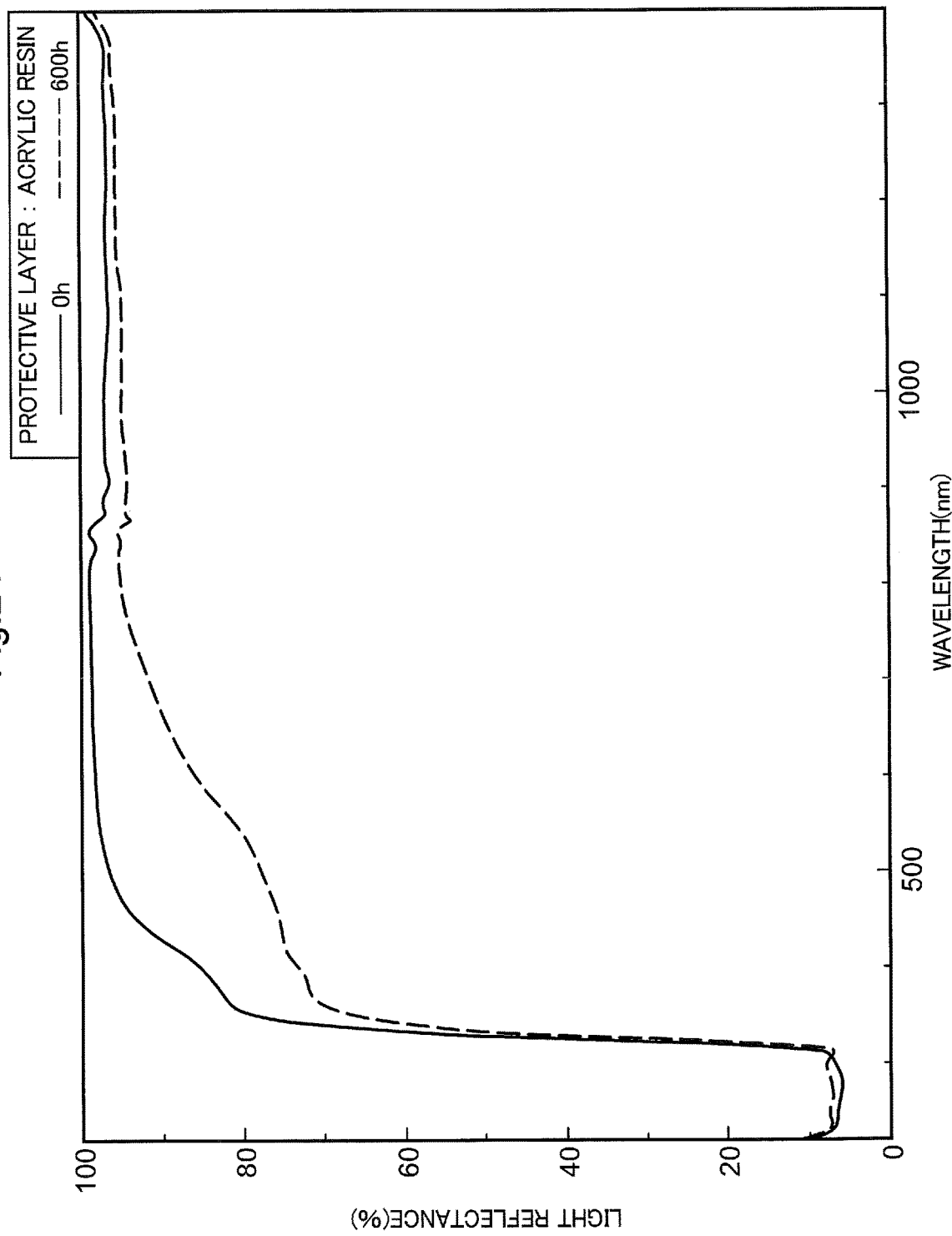
FIG. 24 is a diagram showing a test result of a case where the protective layer is made of an ultraviolet absorbing acrylic resin.

As shown in FIG. 24, in the case where the protective layer D was formed from the acrylic resin that absorbs ultraviolet rays well, the protective layer D was decomposed by ultraviolet rays and formed radicals, silver was immediately discolored to yellow, and the sample failed to operate as the radiative cooling device CP no longer (absorbed sunlight and the temperature increased under solar radiation, as is the case with common materials).

Note that the line denoted by 600 h in FIG. 24 shows a reflectance spectrum after a xenon weather test (ultraviolet light energy: 60 W/m$^2$) was performed for 600 h (hours) under the conditions specified in JIS 5600-7-7. Also, the line denoted by 0 h shows a reflectance spectrum before the xenon weather test was performed.

Figure 23:
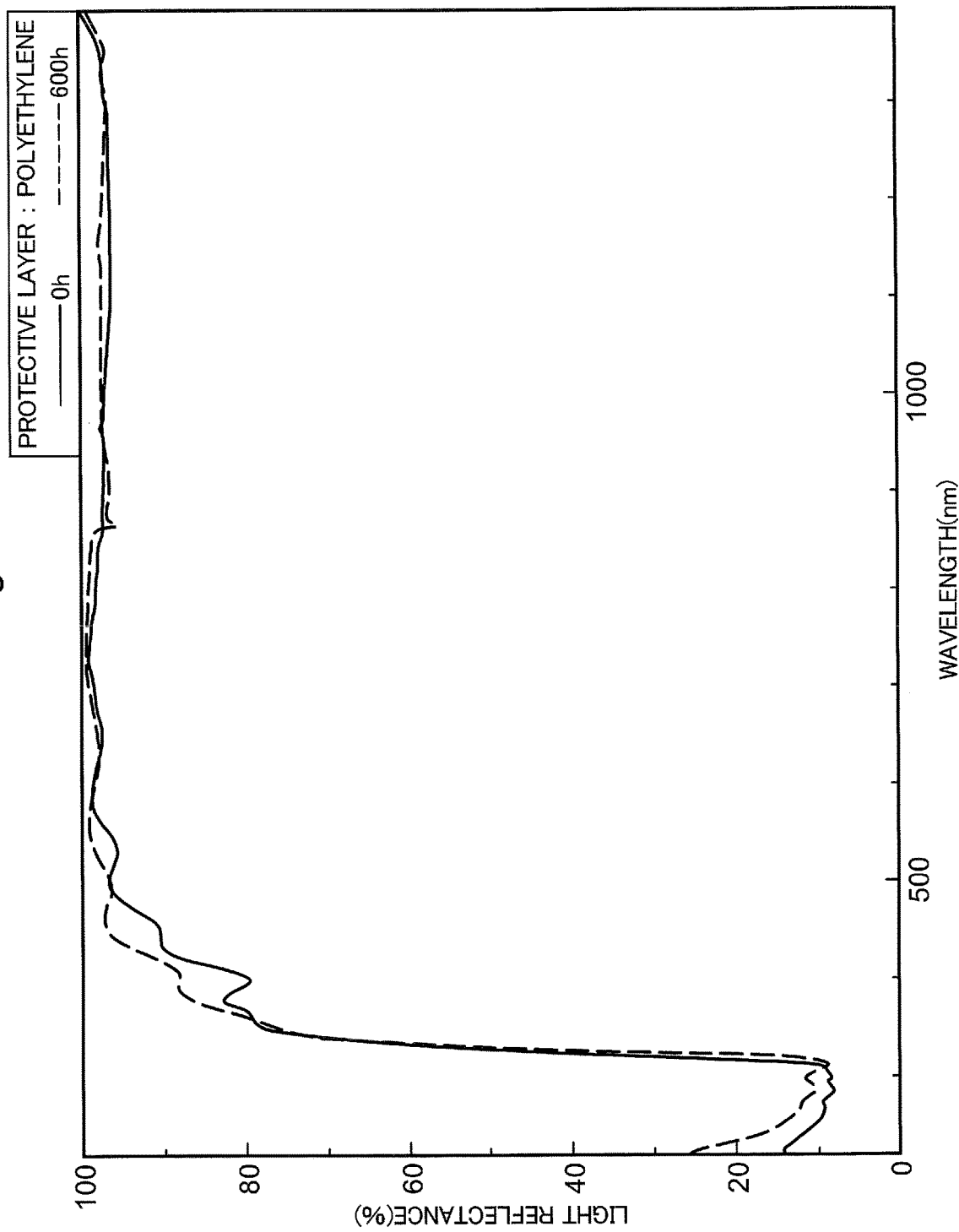
FIG. 23 is a diagram showing a test result of a case where a protective layer is made of polyethylene.

As shown in FIG. 23, in the case where the protective layer D was formed from polyethylene that has a low absorptivity for ultraviolet rays, it can be found that the reflectance did not decrease in the near-infrared range and the visible range. That is, a resin (polyolefin based resin) that contains polyethylene as a main component absorbs almost no ultraviolet rays in the sunlight reaching the ground, and accordingly, is unlikely to form radicals even when irradiated with sunlight. Therefore, silver forming the light reflective layer B is not colored even under solar radiation.

Note that the line denoted by 600 h in FIG. 23 shows a reflectance spectrum after a xenon weather test (ultraviolet light energy: 60 W/m$^2$) was performed for 600 h (hours) under the conditions specified in JIS 5600-7-7. Also, the line denoted by 0 h shows a reflectance spectrum before the xenon weather test was performed.

Note that the reflectance spectrums in this wavelength range wave because of Fabry-Pérot resonance of the polyethylene layer. It can be found that positions of the resonance slightly differ between the line denoted by 0 h and the line denoted by 600 h due to the thickness of the polyethylene layer being changed by heat applied during the xenon weather test, for example, but no significant decrease in the reflectance due to discoloration of silver to yellow is observed in the ultraviolet-visible range.

Note that a fluorocarbon resin can also be used as a material for forming the protective layer D from the viewpoint of ultraviolet absorption, but when the protective layer D is actually formed from a fluorocarbon resin, the fluorocarbon resin is colored and deteriorated while the protective layer D is formed. Therefore, the fluorocarbon resin cannot be used as a material for forming the protective layer D.

Also, silicone can be used as a material for forming the protective layer D from the viewpoint of ultraviolet absorption, but adhesion between silicone and silver (silver alloy) is very bad, and therefore, silicone cannot be used as a material for forming the protective layer D.

[Another Configuration of Radiative Cooling Device]

Figure 26:
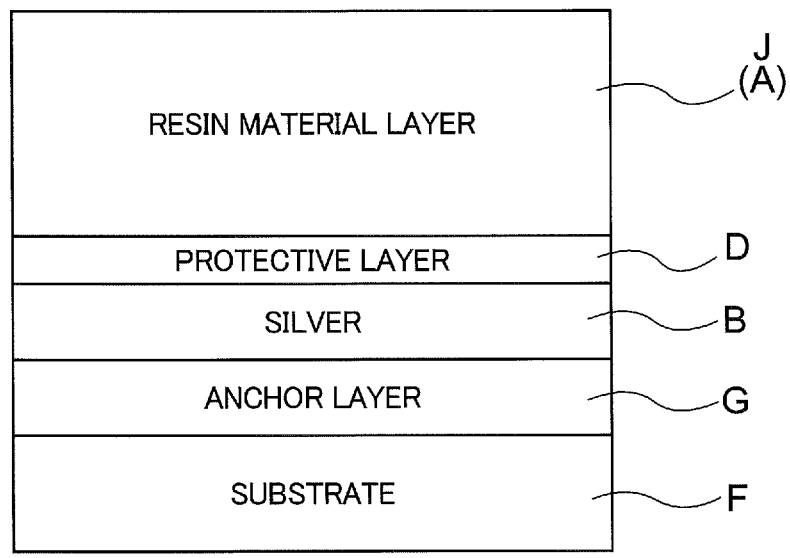
FIG. 26 is a diagram showing another configuration of the radiative cooling device.

As shown in FIG. 26, a configuration is also possible in which an anchor layer G is provided on a film layer F (corresponding to a substrate) and the light reflective layer B, the protective layer D, and the infrared radiative layer A are formed on the anchor layer G.

Note that the film layer F (corresponding to a substrate) is formed in a film shape using PET (ethylene terephthalate resin) or the like.

The anchor layer is introduced to strengthen adhesion between the film layer F and the light reflective layer B. That is, when a silver (Ag) layer is directly formed on the film layer F, the silver layer is easily peeled off. It is desirable that the anchor layer G contains an acrylic resin, a polyolefin, or urethane as a main component and a compound that has an isocyanate group or a melamine resin is mixed therein. The anchor layer is a coating applied to a portion that is not directly irradiated with sunlight, and may be a constituted by a material that absorbs ultraviolet rays.

Note that adhesion between the film layer F and the light reflective layer B can be strengthened using a method other than the method of introducing the anchor layer G. For example, adhesion is strengthened when the surface of the film layer F, on which another layer is to be formed, is roughened by being irradiated with plasma.

[Another Configuration of Infrared Radiative Layer]

Figure 27:
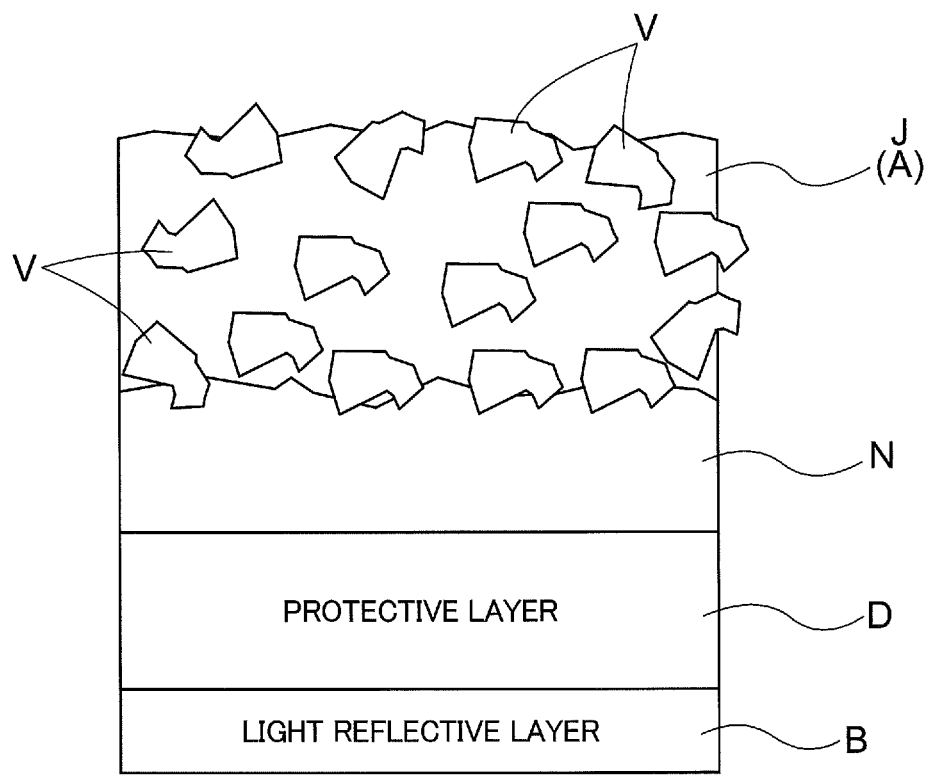
FIG. 27 is a diagram showing a configuration in which a filler is mixed in a resin material layer.
Figure 28:
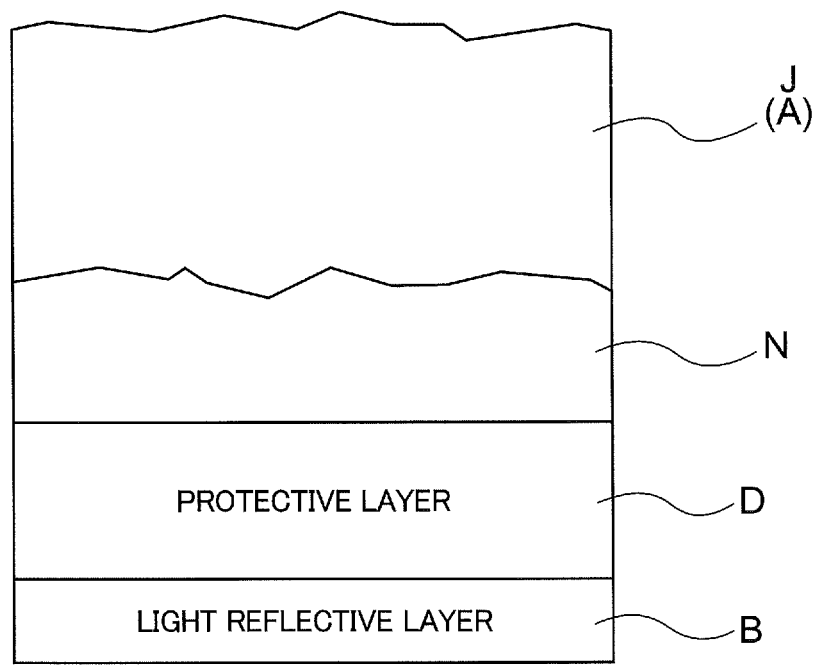
FIG. 28 is a diagram showing a configuration in which irregularities are formed on front and rear surfaces of the resin material layer.

As shown in FIG. 27, a filler V constituted by an inorganic material may be mixed in the resin material layer J constituting the infrared radiative layer A to provide a light scattering configuration. Alternatively, irregularities may be formed on front and rear surfaces of the resin material layer J constituting the infrared radiative layer A as shown in FIG. 28 to provide a light scattering configuration.

With these configurations, it is possible to suppress a glare on the radiative surface H when the radiative surface H is seen.

That is, front and rear surfaces of the resin material layer J described above are both flat and a filler V is not mixed in the resin material layer J. In this case, the radiative surface H is a mirror surface and there is a glare when the radiative surface H is seen, but the glare can be suppressed with the light scattering configurations.

In the case where the filler V is mixed in the resin material layer J, the light reflectance is improved when there are the protective layer D and the light reflective layer B, compared with a case where there is only the resin material layer J in which the filler V is mixed or there is only the light reflective layer B.

As the inorganic material constituting the filler V, silicon dioxide ($SiO_2$), titanium oxide ($TiO_2$), aluminum oxide ($Al_2O_3$), magnesium oxide (MgO), and the like can be preferably used. When the filler V is mixed in the resin material layer J, irregularities are formed on both of the front and rear surfaces of the resin material layer J.

Alternatively, irregularities can be formed on both of the front and rear surfaces of the resin material layer J through embossing processing or processing for scarring the surfaces, for example.

In the case where the rear surface of the resin material layer J has irregularities, it is desirable to dispose an adhesive layer N (joining layer) between the resin material layer J and the protective layer D as in the configuration shown in FIG. 18.

That is, when the adhesive layer N (joining layer) is disposed between the resin material layer J and the protective layer D, the resin material layer J and the protective layer D can be joined appropriately even if the rear surface of the resin material layer J has irregularities.

In the case where the rear surface of the resin material layer J has irregularities, it is also possible to directly join the resin material layer J and the protective layer D through plasma bonding, for example. Plasma bonding is a method of forming radicals by emitting plasma toward surfaces of the resin material layer J and the protective layer D to be joined together and joining the surfaces using the radicals.

When the filler V is mixed in the protective layer D, irregularities are formed on the rear surface of the protective layer D that comes into contact with the light reflective layer B, and consequently irregularities are formed on the surface of the light reflective layer B, and therefore, the filler V needs to be kept from being mixed in the protective layer D. That is, when irregularities are formed on the surface of the light reflective layer B, the light reflective layer B cannot reflect light appropriately, and consequently, radiative cooling cannot be performed appropriately.

In this regard, an experimental result will be described based on FIG. 29.

Figure 29:
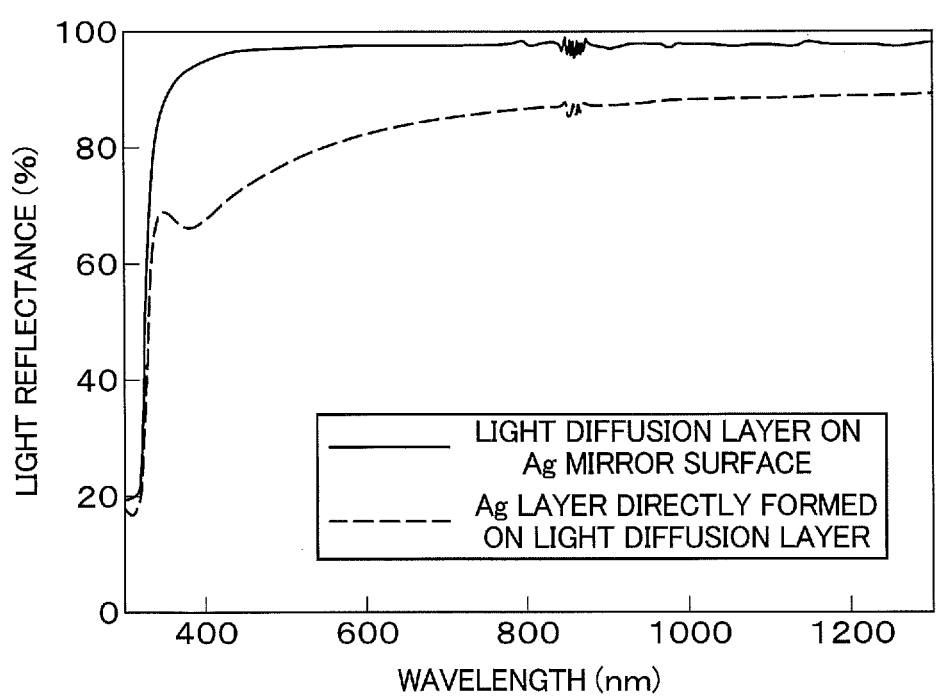
FIG. 29 is a graph showing an experimental result.

In FIG. 29, "Ag layer directly formed on light diffusion layer" means that the light reflective layer B was formed from silver (Ag) through vapor deposition or the like on a surface of the infrared radiative layer A (resin material layer J) in which a filler V was mixed or irregularities were formed through embossing processing on a surface facing the Ag layer, i.e., the light reflective layer B.

Also, "light diffusion layer on Ag mirror surface" means that the upper surface of the Ag layer, i.e., the light reflective layer B, was formed into a mirror surface, and the protective layer D and the infrared radiative layer A (resin material layer J) in which a filler V was mixed or irregularities were formed through embossing processing were stacked on the Ag layer.

As shown in FIG. 29, in the case of "Ag layer directly formed on light diffusion layer", irregularities were formed on a surface of the light reflective layer B, and therefore, the light reflectance significantly decreased, but in the case of "light diffusion layer on Ag mirror surface", the mirror surface of the light reflective layer B was maintained and an appropriate reflectance was obtained.

Other Embodiments

Other embodiments will be listed below.

(1) In the above embodiment, various resin materials are described as examples of the resin material forming the resin material layer J, but examples of resin materials that can be preferably used include a vinyl chloride resin (PVC), a vinylidene chloride resin (PVDC), a vinyl fluoride resin (PVF), and a vinylidene fluoride resin (PVDF).

(2) In the above embodiment, an object that is in close contact with the rear surface of the radiative cooling device CP (radiative cooling film) is described as an example of the cooling target E, but the radiative cooling device CP is applicable to various cooling targets E such as a space to be cooled.

(3) In the above embodiment, configurations in which the radiative surface H of the resin material layer J is exposed are described as examples, but a configuration is also possible in which the radiative surface H is covered with a hard coat.

Examples of materials of the hard coat include a UV-curable acrylic material, a thermosetting acrylic material, a UV-curable silicone material, a thermosetting silicone material, an organic-inorganic hybrid material, and vinyl chloride, and any of these may be used. An organic antistatic agent may also be used as an additive.

Among UV-curable acrylic materials, urethane acrylate is particularly preferable.

The hard coat can be formed through gravure coating, bar coating, knife coating, roll coating, blade coating, die coating, or the like.

The thickness of the hard coat (coating layer) is 1 to 50 µm, and particularly preferably 2 to 20 µm.

In a case where a vinyl chloride resin is used as the resin material of the resin material layer J, the amount of a plasticizer for the vinyl chloride resin may be reduced to obtain a rigid vinyl chloride resin or a semi-rigid vinyl chloride resin. In this case, the vinyl chloride of the infrared radiative layer A itself serves as the hard coat layer.

The configurations disclosed in the above embodiments (including the other embodiments, the same applies hereinafter) can be applied in combination with configurations disclosed in other embodiments. Also, the embodiments disclosed in the present specification are examples, and embodiments of the present invention are not limited to the disclosed embodiments, and can be modified as appropriate within a range not deviating from the object of the present invention.

DESCRIPTION OF REFERENCE SIGNS

A: infrared radiative layer
B: light reflective layer
D: protective layer
H: radiative surface
J: resin material layer
N: joining layer

The invention claimed is:

1. A radiative cooling device comprising:
an infrared radiative layer configured to radiate infrared light from a radiative surface;
a light reflective layer disposed on a side opposite to the radiative surface with respect to the infrared radiative layer; and
a protective layer disposed between the infrared radiative layer and the light reflective layer, and
wherein:
the infrared radiative layer is a resin material layer that has a thickness adjusted so as to emit a heat radiation energy greater than an absorbed solar energy in a wavelength range from 8 µm to 14 µm,
the light reflective layer contains silver or a silver alloy, and
the protective layer is formed from a polyolefin based resin with a thickness of 300 nm or more and 40 µm or less or an ethylene terephthalate resin with a thickness of 17 µm or more and 40 µm or less.

2. The radiative cooling device according to claim 1, wherein the light reflective layer has a reflectance of 90% or more for light having a wavelength within a range from 0.4 µm to 0.5 µm and a reflectance of 96% or more for light having a wavelength longer than 0.5 µm.

3. The radiative cooling device according to claim 1, wherein the thickness of the resin material layer is adjusted such that the resin material layer has:
light absorption properties that satisfy a wavelength average absorptivity of 13% or less in a wavelength range from 0.4 µm to 0.5 µm, a wavelength average absorptivity of 4% or less in a wavelength range from 0.5 µm to 0.8 µm, a wavelength average absorptivity of 1% or less in a wavelength range from 0.8 µm to 1.5 µm, and a wavelength average absorptivity of 40% or less in a wavelength range from 1.5 µm to 2.5 µm; and
heat radiation properties that satisfy a wavelength average emissivity of 40% or more in a wavelength range from 8 µm to 14 µm.

4. The radiative cooling device according to claim 1, wherein a resin material forming the resin material layer is selected from resin materials that have any one or two or more of a carbon-fluorine bond, a siloxane bond, a carbon-chlorine bond, a carbon-oxygen bond, an ether bond, an ester bond, and a benzene ring.

5. The radiative cooling device according to claim 1, wherein a resin material forming the resin material layer contains siloxane as a main component, and
wherein the resin material layer has a thickness of 1 µm or more.

6. The radiative cooling device according to claim 4, wherein the resin material layer has a thickness of 10 µm or more.

7. The radiative cooling device according to claim 1, wherein the resin material layer has a thickness of 20 mm or less.

8. The radiative cooling device according to claim 7, wherein a resin material forming the resin material layer is a fluorocarbon resin or silicone rubber.

9. The radiative cooling device according to claim 1, wherein a resin material forming the resin material layer is a resin material that contains, as a main chain, a hydrocarbon that has any one or two or more of a carbon-chlorine bond, a carbon-oxygen bond, an ester bond, an ether bond, and a benzene ring, or a silicone resin that contains a hydrocarbon having 2 or more carbon atoms as a side chain, and
wherein the resin material layer has a thickness of 500 µm or less.

10. The radiative cooling device according to claim 1, wherein a resin material forming the resin material layer is a blend of a resin that has a carbon-fluorine bond or a siloxane bond and a resin that contains a hydrocarbon as a main chain, and the resin material layer has a thickness of 500 µm or less.

11. The radiative cooling device according to claim 1, wherein a resin material forming the resin material layer is a fluorocarbon resin, and
wherein the resin material layer has a thickness of 300 µm or less.

12. The radiative cooling device according to claim 1, wherein a resin material forming the resin material layer is a resin material that has any one or two or more of a carbon-chlorine bond, a carbon-oxygen bond, an ester bond, an ether bond, and a benzene ring, and
wherein the resin material layer has a thickness of 50 µm or less.

13. The radiative cooling device according to claim 1, wherein the resin material forming the resin material layer is a resin material having a carbon-silicon bond, and
wherein the resin material layer has a thickness of 10 µm or less.

14. The radiative cooling device according to claim 1,
wherein a resin material forming the resin material layer is a vinyl chloride resin or a vinylidene chloride resin, and
wherein the resin material layer has a thickness of 10 μm or more and 100 μm or less.

15. The radiative cooling device according to claim 1, wherein the light reflective layer is constituted by silver or a silver alloy and has a thickness of 50 nm or more.

16. The radiative cooling device according to claim 1, wherein the light reflective layer has a layered structure constituted by silver or a silver alloy disposed adjacent to the protective layer and aluminum or an aluminum alloy disposed apart from the protective layer.

17. The radiative cooling device according to claim 1, wherein the resin material layer, the protective layer, and the light reflective layer stacked on each other have a film shape.

18. The radiative cooling device according to claim 1, wherein the resin material layer and the protective layer are joined by a joining layer constituted by an adhesive agent or a pressure-sensitive adhesive agent.

19. The radiative cooling device according to claim 18, wherein a filler constituted by an inorganic material is mixed in the resin material layer.

20. The radiative cooling device according to claim 18, wherein irregularities are formed on both of front and rear surfaces of the resin material layer.

21. A radiative cooling method in which the radiative cooling device according to claim 1 is used to radiate the infrared light from the radiative surface disposed on a side opposite to a surface of the resin material layer that is in contact with the light reflective layer, the radiative cooling method comprising:
orienting the radiative surface toward the sky to allow the radiative surface to radiate the infrared light.

* * * * *